United States Patent
Grau et al.

(10) Patent No.: US 9,748,088 B2
(45) Date of Patent: Aug. 29, 2017

(54) METHOD, STORAGE MEDIUM AND SYSTEM FOR CONTROLLING THE PROCESSING OF LOTS OF WORKPIECES

(71) Applicant: GLOBALFOUNDRIES Inc., Grand Kayman (KY)

(72) Inventors: Gero Grau, Dresden (DE); Steffen Kalisch, Radebeu (DE); Joerg Weigang, Dresden (DE); William John Fosnight, Saratoga Springs, NY (US); Chinmay Oza, Mechanicville, NY (US); Detlef Pabst, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 933 days.

(21) Appl. No.: 14/100,610

(22) Filed: Dec. 9, 2013

(65) Prior Publication Data

US 2015/0162180 A1 Jun. 11, 2015

(51) Int. Cl.
| | |
|---|---|
| *H01L 21/02* | (2006.01) |
| *H01L 21/677* | (2006.01) |
| *G05B 17/02* | (2006.01) |
| *G05B 19/042* | (2006.01) |
| *G05B 19/418* | (2006.01) |

(52) U.S. Cl.
CPC .............. *H01L 21/02* (2013.01); *G05B 17/02* (2013.01); *G05B 19/0426* (2013.01);
(Continued)

(58) Field of Classification Search
CPC ... H01L 21/02; H01L 21/67727; G05B 17/02; G05B 19/0426; G06Q 10/08
(Continued)

(56) References Cited

U.S. PATENT DOCUMENTS

| | | | |
|---|---|---|---|
| 5,980,183 A | 11/1999 | Fosnight | |
| 6,947,803 B1 * | 9/2005 | Bode | H01L 21/67253 438/5 |

(Continued)

FOREIGN PATENT DOCUMENTS

TW 200725447 A 7/2007

OTHER PUBLICATIONS

Translation of Official Action for Taiwanese Patent Application No. 103136419 dated May 27, 2016.
(Continued)

*Primary Examiner* — Miranda Huang
*Assistant Examiner* — Sivalingam Sivanesan
(74) *Attorney, Agent, or Firm* — Amerson Law Firm, PLLC

(57) ABSTRACT

A method includes processing each of a plurality of lots with at least one first equipment and moving some of the plurality of lots to a first storage. For each of a plurality of second equipments, an expected dispatch time of one or more next lots for processing by the second equipment is determined. Each of the lots in the first storage is assigned to one of the plurality of second equipments on the basis of at least the determined expected dispatch times and moved to one of a plurality of second storages that is associated with one of the plurality of second equipments to which the respective lot was assigned. For each of the plurality of second equipments, each of the lots in the second storage associated with the second equipment is moved to the second equipment and are processed with the second equipment.

25 Claims, 8 Drawing Sheets

(52) U.S. Cl.
CPC .. *G05B 19/41875* (2013.01); *H01L 21/67727* (2013.01); *G05B 2219/23006* (2013.01); *Y02P 90/20* (2015.11); *Y02P 90/22* (2015.11)

(58) Field of Classification Search
USPC ............................ 700/121; 709/205; 703/2, 6
See application file for complete search history.

(56) References Cited

U.S. PATENT DOCUMENTS

| | | | |
|---|---|---|---|
| 2003/0229412 A1* | 12/2003 | White | G06F 17/5068 700/121 |
| 2008/0163096 A1* | 7/2008 | Pannese | G05B 19/4069 715/772 |
| 2008/0275582 A1 | 11/2008 | Nettles et al. | |
| 2009/0055043 A1* | 2/2009 | Mian | B61L 27/0094 701/31.4 |
| 2009/0097950 A1* | 4/2009 | Tanaka | H01L 21/67276 414/222.13 |
| 2013/0079913 A1* | 3/2013 | Oza | H01L 21/67276 700/100 |

OTHER PUBLICATIONS

Official Action for Korean Patent Application No. 10-2014-0176100 dated Apr. 15, 2016.

\* cited by examiner

METHOD, STORAGE MEDIUM AND SYSTEM FOR CONTROLLING THE PROCESSING OF LOTS OF WORKPIECES

BACKGROUND OF THE INVENTION

1. Field of the Invention

Generally, the present disclosure relates to the manufacturing of products, and, in particular, to the manufacturing of semiconductor devices by means of semiconductor tools.

2. Description of the Related Art

In the manufacturing of products having a relatively high degree of complexity, for example, semiconductor devices such as integrated circuits, a number of different manufacturing processes are performed by means of a plurality of tools. Examples of tools that can be used in the manufacturing of integrated circuits include steppers for performing photolithography processes, deposition tools for performing processes for the deposition of material layers on semiconductor structures, such as chemical vapor deposition reactors, plasma enhanced chemical vapor deposition reactors, apparatuses for performing physical vapor deposition, atomic layer deposition and/or spin coating, etching tools for performing etch processes, such as dry etching and wet etching, tools for performing processes such as oxidation, annealing and various cleaning processes, and metrology tools for monitoring manufacturing processes and for detecting defects of semiconductor devices in various stages of the manufacturing process.

In the manufacturing process, a number of workpieces, which, in the manufacturing of semiconductor devices typically include semiconductor wafers, each wafer including a number of semiconductor devices in a particular stage of a manufacturing process, may be combined into lots. The workpieces of a lot are processed in substantially the same manner, and typically by means of the same tools. For handling the lots, carriers can be used. The workpieces of a lot are inserted into a carrier for moving the workpieces between the tools that are employed for the manufacturing processes carried out at the workpieces of the lot.

For transporting the carriers, an automated material handling system may be employed, wherein the automated material handling system moves the carrier in an automated manner, for example, by means of vehicles and/or robots which are controlled by a computer system. The computer system can receive data from various tools, as well as from the automated material handling system, and can assign lots of workpieces to particular tools. The assignment of workpieces to tools can be performed on the basis of an availability of particular tools, constraints of the manufacturing process and priorities of the lots. Constraints of the manufacturing process can include maximum allowable queue times that should be observed to avoid adverse influences of long waiting times between some particular critical manufacturing processes on the quality of the manufactured products. Lots that should be processed more quickly, for example in view of delivery deadlines, can obtain a higher priority.

U.S. Pat. No. 5,980,183 discloses a system for the transport and storage of semiconductor wafers that can be used in the manufacturing of semiconductor devices. The system includes a plurality of storage locations that are provided along a wall of a tool bay containing process tools. Storage locations of the plurality of storage locations can be vertically aligned on top of each other. The system further includes a transport mechanism. The transport mechanism is capable of transporting a plurality of pods to and from each of the plurality of storage locations from above and/or from a side of the plurality of storage locations and to and from the plurality of process tools from above and/or from a side of the plurality of process tools without handoff of the plurality of pods during transport of the pods between the plurality of storage locations and between the plurality of storage locations and the plurality of process tools.

Conventionally, lots of workpieces can be assigned to a particular tool as soon as possible, for example as soon as a preceding processing step of a manufacturing process that is performed by another tool is completed. As soon as a lot of workpieces is assigned to a tool, the lot can be moved to the tool and included into a queue of lots that are to be processed by the tool. The lot stays in the queue until the tool is ready to process it. Following this strategy can lead to issues when lots of workpieces that are to be processed with a higher priority than lots that are already in the queue arrive. Reordering lots in the queue can require an undoing of actions taken on the current queue, for example transfers, or it can be associated with additional moves that are to be performed by the automated material handling system, and can be associated with a loss in throughput of the tool.

In view of the situation described above, the present disclosure provides methods, systems and data storage media that can help to substantially avoid or at least reduce some or all of the above-mentioned issues.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes processing each of a plurality of lots with a respective one of at least one first equipment. At least some of the plurality of lots are moved from the respective one of the at least one first equipment to a first storage. For each of a plurality of second equipments, an expected dispatch time of one or more next lots for processing by the second equipment is determined. Each of the lots in the first storage is assigned to one of the plurality of second equipments on the basis of at least the determined expected dispatch times. Each of the lots in the first storage is moved to one of a plurality of second storages that is associated with the one of the plurality of second equipments to which the respective lot was assigned. For each of the plurality of second equipments, each of the lots in the second storage associated with the second equipment is moved to the second equipment, and the lots from the second storage associated with the second equipment are processed with the second equipment.

Another illustrative method disclosed herein includes providing a first model. The first model relates at least data from a tool to an expected dispatch time of one or more next lots for processing by the tool. At least the data from the tool are received, and the first model and the received data are used to determine the expected dispatch time. One or more first lots of workpieces are assigned to the tool on the basis of the determined expected dispatch time, the one or more lots of workpieces are moved to the tool and the one or more lots of workpieces are processed by means of the tool. A measure of accuracy of the determined expected dispatch time is determined, and the first model is updated on the basis of the determined measure of accuracy.

An illustrative system disclosed herein includes a data processing arrangement, at least one first equipment, a plurality of second equipments, an automated material handling system, a first storage and a plurality of second storages. Each of the plurality of second equipments is associated with a respective one of the plurality of second storages. The automated material handling system moves at least some of a plurality of lots from a respective one of the at least one first equipment to the first storage. The data processing arrangement determines, for each of the plurality of second equipments, an expected dispatch time of one or more next lots for processing by the second equipments, assigns each of the lots in the first storage to one of the plurality of second equipments on the basis of at least the expected dispatch times and sends one or more first signals and one or more second signals to the automated material handling system. In response to the one or more first signals from the data processing arrangement, the automated material handling system moves each of the lots in the first storage to the one of the plurality of second storages that is associated with the one of the plurality of second equipments to which the respective lot was assigned. In response to the one or more second signals from the data processing arrangement, the automated material handling system moves each of the lots in each of the plurality of second storages to the one of the plurality of second equipments associated with the respective second storage. Each of the plurality of second equipments processes the lots received from the automated material handling system.

Another illustrative system disclosed herein includes means for processing each of a plurality of lots with a respective one of at least one first equipment, means for moving each of the lots from the respective one of the at least one first equipment to a first storage, means for determining, for each of a plurality of second equipments, an expected dispatch time of one or more next lots for processing by the second equipment, means for assigning each of the lots in the first storage to one of the plurality of second equipments on the basis of at least the determined expected dispatch times, means for moving each of the lots in the first storage to one of a plurality of second storages that is associated with the one of the plurality of second equipments to which the respective lot was assigned, and means for moving, for each of the plurality of second equipments, each of the lots in the second storage associated with the second equipment to the second equipment and processing the lots from the second storage associated with the second equipment with the second equipment.

An illustrative computer readable storage medium disclosed herein includes code for causing a data processing arrangement to provide a model, the model relating at least data from a tool to an expected dispatch time of one or more next lots for processing by the tool, receive at least the data from the tool through a network connection, use the model and the received data to determine the expected dispatch time, assign one or more lots of workpieces to the tool on the basis of the determined expected dispatch time, send a first signal to an automated material handling system through the network connection, the signal causing the automated material handling system to move the one or more lots of workpieces to the tool, send a second signal to the tool through the network connection, the second signal causing the tool to process the one or more lots of workpieces, determine a measure of accuracy of the determined expected dispatch time, and update the model on the basis of the determined measure of accuracy.

BRIEF DESCRIPTION OF THE DRAWINGS

The disclosure may be understood by reference to the following description taken in conjunction with the accompanying drawings, in which like reference numerals identify like elements, and in which.

Figure 1:
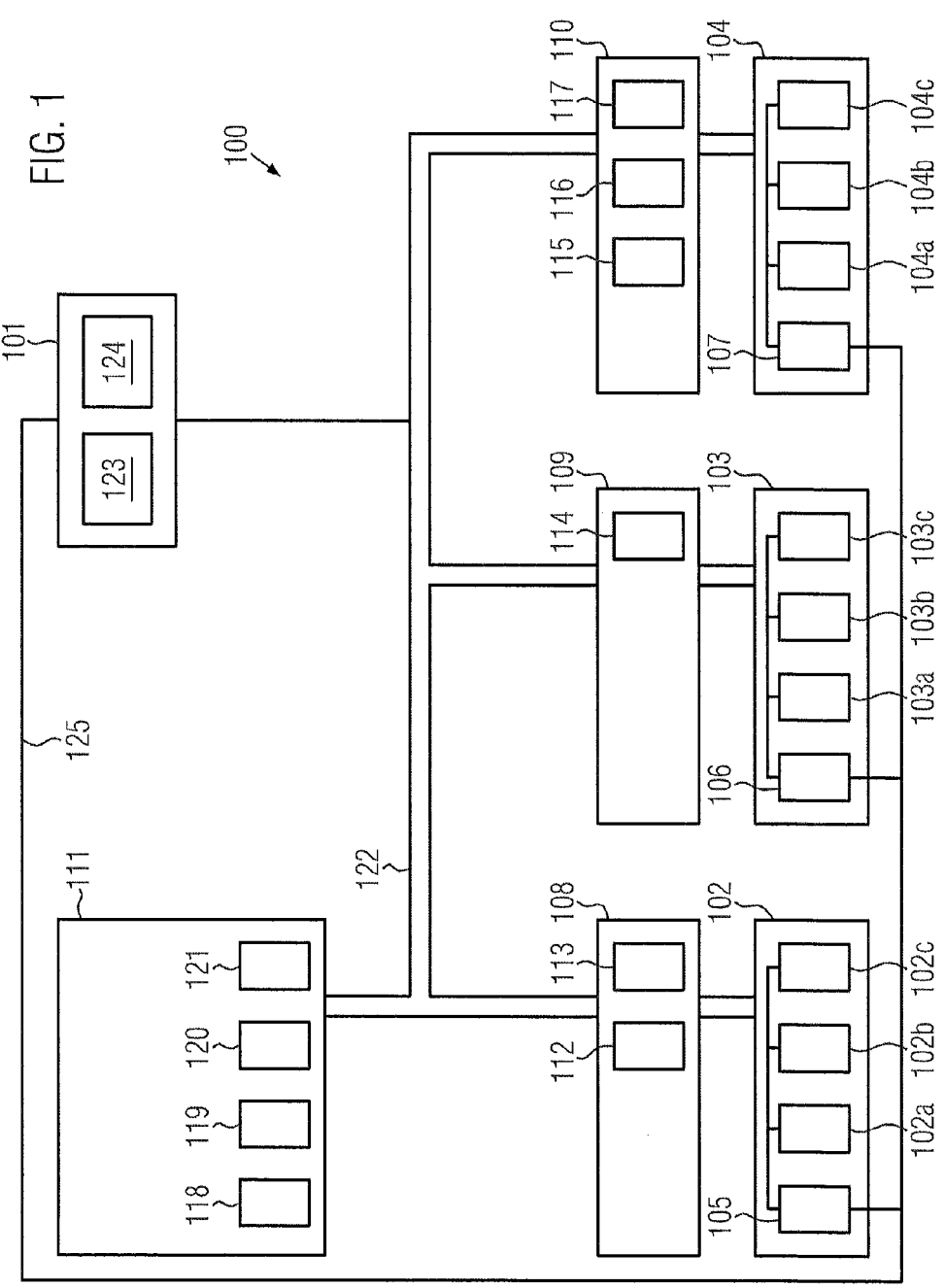
FIG. 1 shows a schematic block diagram of a system according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Illustrative embodiments disclosed herein provide a universal, distributed and scalable heuristic method combined with data mining for just-in-time dispatching and pickup of work-in-process without loss in throughput. The work-in-process may include, in particular, unfinished workpieces from which products are to be formed, wherein the workpieces may be grouped in lots. In some embodiments, the workpieces may include semiconductor wafers.

For just-in-time dispatching of work-in-process, an approximate latest reservation time, which will sometimes be denoted as "decision time" herein, may be calculated for each tool and/or equipment, each equipment including one or more tools, wherein assigning a lot of workpieces to a tool or equipment at the latest reservation time and subsequently dispatching the lot to the tool or equipment still allows providing the lot to the tool early enough to substantially avoid a time during which the tool or equipment is idle before the processing of the lot is started. The latest reservation time may be calculated on the basis of a model for each type of tool and/or equipment that predicts a next throughput maximizing lot delivery time. Additionally, in the calculation of the latest reservation time, the transport time for a lot may be considered. The throughput maximizing lot delivery time and an estimate of the transport time may be combined into a dispatch time of one or more next lots to the tool or equipment, and the latest reservation time may be set to a point in time that is approximately equal to the dispatch time.

Just-in-time dispatching may help to substantially avoid or at least reduce a likelihood of insufficient dispatch decisions which may occur when lots are immediately assigned to the next free tool or equipment and other lots having a greater priority than the dispatched lot appear during a waiting time, as described above. If lots are assigned to the next free tool and/or equipment immediately after the completion of a preceding step of a manufacturing process that is carried out at the workpieces of the lot, relatively long waiting times of lots at the tools and/or equipments may occur.

Lot pickup approaches may be based on similar models for the tools and/or equipments that predict the next throughput maximizing or cycle time minimizing lot pickup time. Thus, just-in-time approaches may be used for dispatching and pickup of lots, which may help to provide longer cascades and/or reduce a cycle time for priority lots.

In some embodiments, three or more moves may be performed for transporting a lot that has been processed by a first equipment to a second equipment that is used for a subsequent processing of the lot. In the first move, the lot is moved from the first equipment to a first storage, which may be, for example, a bulk storage. In the second move, the lot is transported from the first storage to a second storage, for example a buffer storage, and in the third move, the lot is moved from the second storage to the second equipment. The first storage may be a stocker that is relatively close to the first equipment and will hold the bulk of material. The second storage may be another stocker that is relatively close to the second equipment and may have just the size to provide a sufficient supply of lots to the second equipment when there is a delay in the supply of lots. Delays in the supply of lots may be caused, for example, by a relatively high load of an automated material handling system, and/or when carriers including lots that are to be processed by the second equipment are widely spread over the factory.

Thus, changing lot priorities may be taken into account when the lots in the first storage are assigned to equipments. Since the transport from the first storage to the second storage may be performed at a relatively short time before the processing of the lot by the second equipment starts, the assignment of lots to equipments may take changing priorities occurring at a relatively late point in time into account. At the same time, using the second storage may help buffering delays of the supply of lots, so that idle times of the second equipment due to delays in the supply of lots by the automated material handling system may be reduced. Moreover, changing circumstances like downtimes of equipments or unexpected lots may be considered. In some embodiments, the second storage may be provided just above a load port of the second equipment.

In some embodiments, an external work-in-process optimization system, for example a real-time dispatch system, may be allowed to provide input as to which lot is to be dispatched next substantially immediately before one of the lots in the first storage is sent to the second storage, or substantially immediately before a lot from the second storage is sent to the equipment. Thus, a queue including lots of workpieces may be reordered. The queue could be in the first storage or in the second storage described above.

In some embodiments, a determination when lots are to be sent from the first storage to the second storage may be based on lot priorities, as well as a utilization and status of the first storage and/or the second storage, in addition to the expected dispatch time when the next lot will be dispatched to the second equipment. Thus, lot priorities, transport times from the two different storages and the next time the second equipment requires a lot may be balanced.

In some embodiments, data mining may be used to automatically identify statistical patterns in real-time dynamic data from each type of tool and/or equipment in a factory. This may be done substantially without relying on detailed knowledge of the internal tool behavior. The patterns may be processed to produce models that may be used in substantially real time to make decisions for just-in-time dispatching and/or pickup of work-in-process. The models may, for example, be used for determining expected dispatch times and/or expected pickup times. Data mining may be combined with a learning process wherein the recognition of statistical patterns is constantly adapted and/or improved.

Thus, a relatively precise just-in-time dispatching and just-in-time pickup may be obtained. This may allow delaying a decision to dispatch work-in-process, in particular dispatching lots of workpieces including semiconductor wafers, so that higher preference work-in-process may be accommodated, even if preferences of work-in-process change constantly. Different models may be used for dispatching and pickup. At a decision time, methods according to embodiments may communicate with a global work-in-process optimization system on which work-in-process is to be dispatched next. This may be done if there are different possibilities for assigning lots to a particular tool and/or equipment and/or if there is a change in queue of lots from the last time a decision was made.

In some embodiments, when work-in-process is available before a tool or equipment and/or a buffer storage associated with the tool or equipment are ready to accept it, it may be prepositioned at an intermediary step in a way that it is available at the shortest route to tools in line to process it, for example in an appropriately selected bulk storage, as described above. This prepositioning of work-in-process may lead to higher optimization of an automated material handling system, and accelerated delivery of work-in-process.

FIG. 1 shows a schematic block diagram of a system 100 according to an embodiment. The system 100 may be, for example, a factory for the manufacturing of semiconductor devices. The system 100 includes a plurality of equipments 102, 103, 104.

In some embodiments, each of the equipments 102, 103, 104 may include a plurality of tools. In FIG. 1, reference numerals 102a, 102b, 102c denote tools of equipment 102, reference numerals 103a, 103b, 103c denote tools of equipment 103, and reference numerals 104a, 104b, 104c denote tools of equipment 104. The number of tools in each of the equipments 102, 103, 104 need not be three, as shown in FIG. 1. Moreover, the number of tools in the equipments 102, 103, 104 need not be equal.

The present disclosure is not limited to embodiments wherein each of the equipments 102, 103, 104 includes more than one tool, as shown in FIG. 1. In other embodiments, one or more of the equipments 102, 103, 104 may include a single tool. Accordingly, the term "equipment" is to be generally understood as a set of one or more tools.

The equipments 102, 103, 104 may include different types of tools. In some embodiments, the equipment 102 may be a first equipment, being an equipment of a first type. For example, the first equipment may include one or more ion implantation tools that may be used for implanting ions of a dopant into semiconductor structures. For example, the first equipment 102 may be employed for doping extended source and drain regions which are provided adjacent gate electrodes of field effect transistors.

The equipments 103, 104 may be second equipments of a second type of equipments. For example, each of the equipments 103, 104 may include one or more plasma enhanced chemical vapor deposition reactors that are used for depositing a layer of material over semiconductor structures. In some embodiments, the second equipments 103, 104 may, for example, be used for depositing a layer of a sidewall spacer material over semiconductor structures after an implantation of dopants into the extended source and drain regions.

The tools of the equipments 102, 103, 104 need not be tools of the same type. In some embodiments, the tools of each of the equipments 102, 103, 104 may be adapted for performing different steps of a manufacturing process that may be performed successively in a manufacturing process.

For example, in embodiments wherein the equipment 102 is used for performing ion implantation processes, one of the tools 102a, 102b, 102c, for example tool 102a, may be an ion implantation tool. Other tools of the equipment 102, for example tools 102b, 102c, may be tools for performing steps that are performed before and/or after the ion implantation, for example, photolithography tools for forming masks that are employed for selectively implanting ions into only a portion of a semiconductor structure, or resist strip tools that are used for removing masks after the ion implantation.

In embodiments wherein the equipments 103, 104 are used for performing a plasma enhanced chemical vapor deposition process, each of the equipments 103, 104 may include a plasma enhanced chemical vapor deposition reactor. For example, tools 103a, 104a may be plasma enhanced chemical vapor deposition reactors. Other tools, for example tools 103b, 103c, 104a, 104c, may be tools for performing processes that are performed before and/or after the plasma enhanced chemical vapor deposition process, for example, one or more wet or dry cleaning processes.

The present disclosure is not limited to embodiments wherein, in each of the equipments 102, 103, 104, all tools are different tools. In some embodiments, one or more of the equipments 102, 103, 104 may include a plurality of tools of the same type.

The present disclosure is not limited to embodiments wherein the first equipment 102 includes one or more ion implantation tools and the second equipments 103, 104 includes one or more plasma-enhanced chemical vapor deposition reactors. In other embodiments, the first equipment 102 and the second equipments 103, 104 may be equipments of different types, wherein, the second equipments 103, 104 may be equipments of the same type or at least of similar type, and each of the second equipments 103, 104 is suitable for performing one or more next steps of a semiconductor manufacturing process after one or more steps performed by the first equipment 102.

In some embodiments, the first equipment 102 and/or the second equipments 103, 104 may include one or more tools selected from the group of tools including steppers for performing photolithography processes, deposition tools for performing processes for the deposition of material layers on semiconductor structures, such as chemical vapor deposition reactors, plasma enhanced chemical vapor deposition reactors, apparatuses for performing physical vapor deposition, atomic layer deposition and/or spin coating, etching tools for performing etch processes, such as dry etching and wet etching, tools for performing processes such as oxidation, annealing and various cleaning processes, and metrology tools for monitoring manufacturing processes and for detecting defects of semiconductor devices in various stages of the manufacturing process.

Moreover, the present disclosure is not limited to embodiments wherein there is one first equipment 102 and two second equipments 103, 104, as shown in FIG. 1. In other embodiments, there may be two or more first equipments, and more than two second equipments, and the system may include a plurality of further equipments in addition to the first and second equipments.

Each of the equipments 102, 103, 104 may include a host, being a computer that is connected to the respective equipment, and controls the operation of the tools of the equipment. In FIG. 1, reference numeral 105 denotes a host of the equipment 102, reference numeral 106 denotes a host of the equipment 103, and reference numeral 107 denotes a host of the equipment 104. Each of the hosts 105, 106, 107 may be connected to a network 125, and may provide an equipment interface for receiving data, for example data relating to the control of the operation of the tools of one of the equipments 102, 103, 104 wherein the respective host is provided though the network 125 and for providing data relating to current or historical states of one of the equipments 102, 103, 104 and/or the tools of the respective equipment through the network 125.

The system 100 further includes a data processing arrangement 101 that may be connected to the network 125. The data processing arrangement 101 may include one or more computers. Each of the computers of the data processing arrangement 101 may include a processor and memory, wherein the memory may include volatile and nonvolatile memory. In the memory of each of the computers of the data processing arrangement 101, code for controlling the operation of the equipments 102, 103, 104 and other components of the system 100 by sending signals to the equipments 102, 103, 104 and the other components of the system 100 through the network 125 may be provided, as will be explained in more detail below.

In some embodiments, the data processing arrangement 101 may include a just-in-time module 123 and a real-time dispatcher module 124, wherein, in some embodiments, each of the just-in-time module 123 and the real-time dispatcher module 124 may be provided in the form of a computer program executed by one or more computers of the data processing arrangement. The just-in-time module 123 may be configured for determining dispatch times at which lots of workpieces are dispatched to the equipments 102, 103, 104 for processing by the equipments 102, 103, 104, and pickup times at which processed lots of workpieces are removed from the equipments 102, 103, 104. The real-time dispatcher module 124 may be configured for managing lot priorities, and for determining an order in which lots are processed, if there are two lots requiring processing steps that may be performed by the same equipment.

The data processing arrangement 101 may send data to each of the hosts 105, 106, 107 of the equipments 102, 103, 104 through the network, and may receive data from each of the hosts 105, 106, 107 through the network 125.

The system 100 may further include a plurality of buffer storages 108, 109, 110. Each of the buffer storages 108, 109, 110 is associated with one of the equipments 102, 103, 104. In particular, buffer storage 108 is associated with equipment 102, buffer storage 109 is associated with equipment 103, and buffer storage 110 is associated with equipment 104.

The buffer storage 108 may be used for storing lots of workpieces that are to be processed by equipment 102. In FIG. 1, reference numerals 112, 113 schematically denote lots of workpieces that are provided in the buffer storage 108 and which are to be processed by the equipment 102. Buffer storage 109 may be used for storing lots of workpieces that are to be processed by equipment 103. In FIG. 1, reference numeral 114 denotes a lot of workpieces that are to be processed by equipment 103. Buffer storage 110 may be used for storing lots of workpieces that are to be processed by equipment 104, which are schematically denoted by reference numerals 115, 116, 117. The numbers of lots in the buffer storages 108, 109, 110 shown in FIG. 1 are of a merely exemplary nature.

The system 100 may further include a bulk storage 111. The bulk storage 111 may be used for storing lots of workpieces after the processing of the lots by one or more of the equipments 102, 103, 104. In FIG. 1, reference numerals 118 to 121 schematically denote lots of workpieces in bulk storage 111, wherein the illustrated number of lots in the bulk storage 111 is of a merely exemplary nature.

The system 100 may further include an automated material handling system 122. The automated material handling system 122 may be adapted for moving lots of workpieces between the bulk storage 111, the buffer storages 108, 109, 110 and the equipments 102, 103, 104. In particular, the automated material handling system 122 may be used for moving lots of workpieces that have been processed by any of the equipments 102, 103, 104 to the bulk storage 111, for moving lots of workpieces from the bulk storage 111 to any of the buffer storages 108, 109, 110 and for moving lots of workpieces from any of the buffer storages 108, 109, 110 to the one of the equipments 102, 103, 104 associated with the respective buffer storage 108, 109, 110.

The automated material handling system 122 may include devices for moving lots of workpieces such as, for example, robotic shuttles including grippers, transport vehicles and/or other transporting means such as, for example, conveyor belts.

The automated material handling system 122 may be connected to the data processing arrangement 101 via the network 125. The data processing arrangement 101 may include one or more computers configured to control the movement of lots of workpieces between the equipments 102, 103, 104, the buffer storages 108, 109, 110 and the bulk storage 111 by sending signals to the automated material handling system 122.

In some embodiments, portions of the automated material handling system 122 may be controlled by the hosts 105, 106, 107. For example, host 105 may control portions of the automated material handling system 122 that move lots of workpieces between the buffer storage 108 and the tools 102*a*, 102*b*, 102*c* of equipment 102, host 106 may control portions of the automated material handling system 122 that move lots of workpieces between the buffer storage 109 and the tools 103*a*, 103*b*, 103*c* of equipment 103 and host 107 may control portions of the automated material handling system 122 that move lots of workpieces between the buffer storage 110 and the tools 104*a*, 104*b*, 104*c* of equipment 104.

For transporting lots of workpieces by means of the automated material handling system 122, the workpieces may be inserted into carriers, as will be explained in the following with reference to FIG. 2, wherein description will be made of the transportation of lot 112. For transporting the other lots 113 to 121 in the system 100, similar carriers may be used, and features of the lots 113 to 121 may at least partially correspond to those of lot 112.

Figure 2:
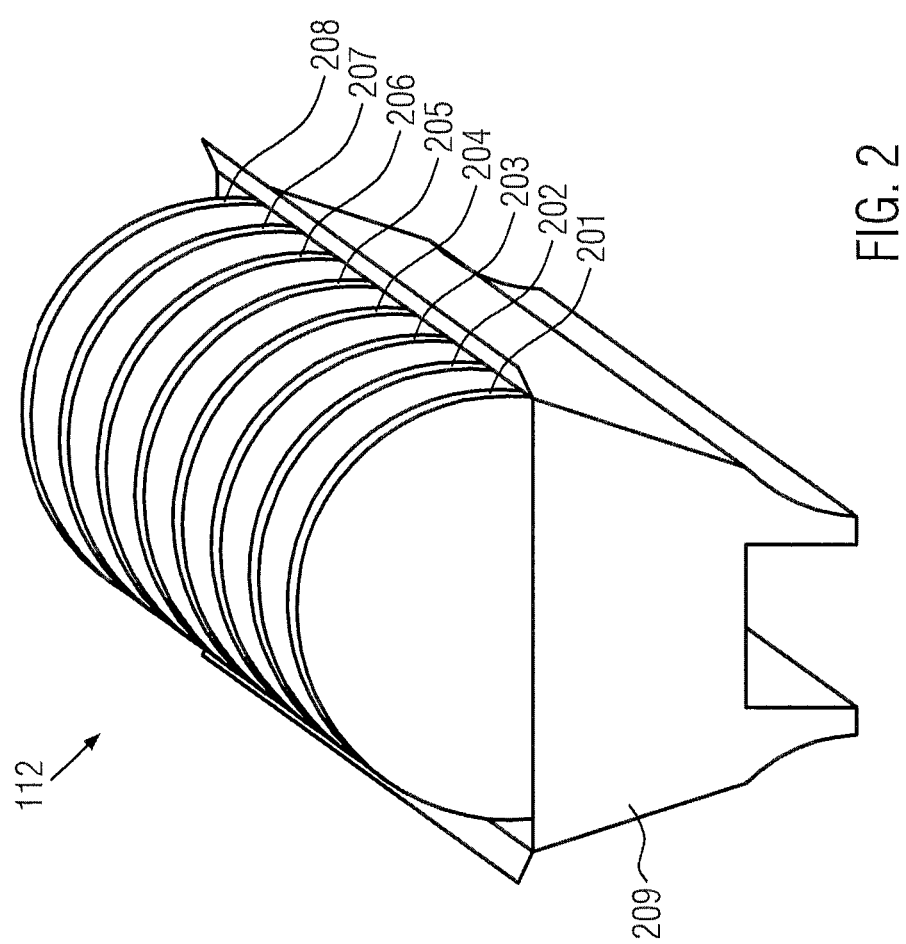
FIG. 2 schematically illustrates a carrier including a lot of semiconductor wafers.

FIG. 2 shows a schematic perspective view of the lot 112. Lot 112 includes a plurality of workpieces 201 to 208, wherein each of the workpieces 201 to 208 may be a semiconductor wafer including a number of semiconductor devices in a stage of a semiconductor manufacturing process. In some embodiments, integrated circuits may be formed from the semiconductor devices on the wafers 201 to 208 in the manufacturing process. However, the present disclosure is not limited to such embodiments. In other embodiments, systems and methods according to the present disclosure may be employed in the formation of semiconductor devices other than integrated circuits such as, for example, light emitting diodes and laser diodes.

The wafers 201 to 208 may be inserted into a carrier 209 that is configured for being transported by the automated material handling system 122. In some embodiments, the carrier 209 may be a wafer carrier for use with conventional standard mechanical interface pods (SMIF pods) or conventional front opening unified pods (FOUP). In some embodiments, the carrier may be a part of a pod. The wafer carrier 209 need not be adapted for receiving eight wafers, as schematically shown in FIG. 2. In other embodiments, the wafer carrier 209 may be adapted for receiving a smaller or greater number of wafers, for example twenty-five wafers.

Figure 3:
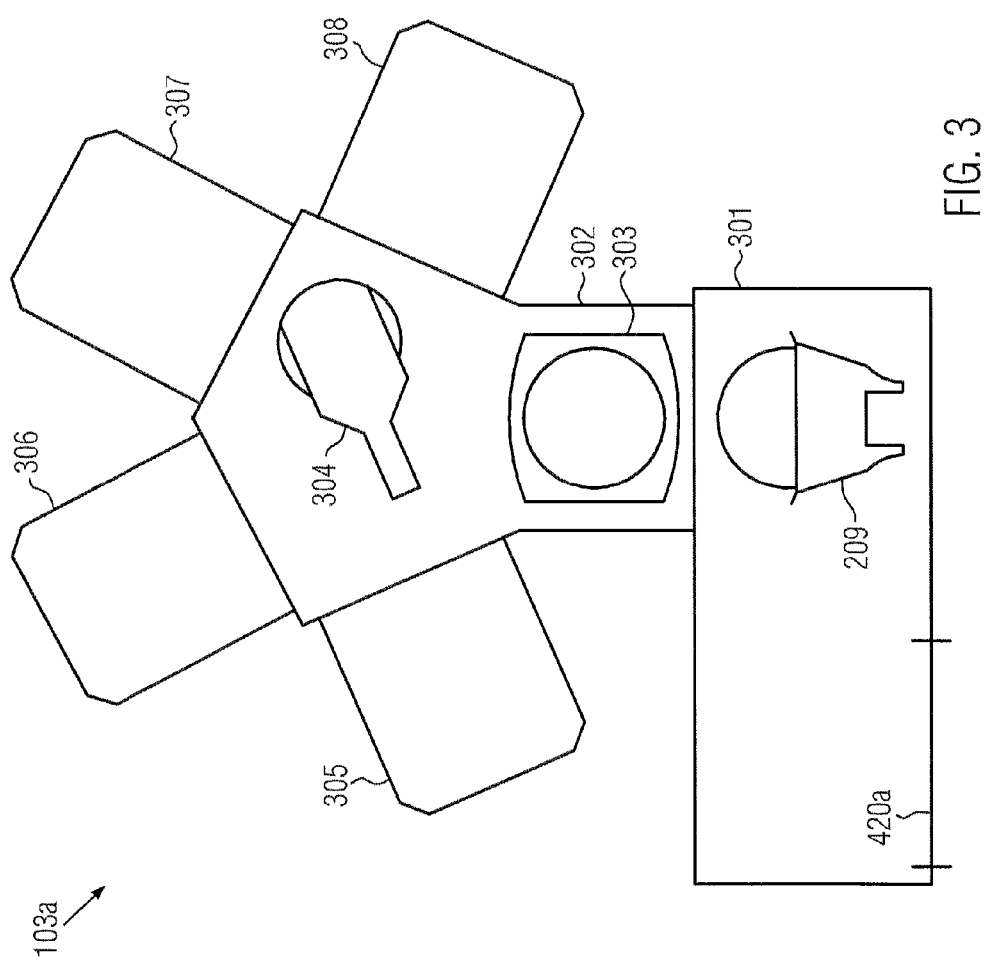
FIG. 3 schematically illustrates a tool.
Figure 4:
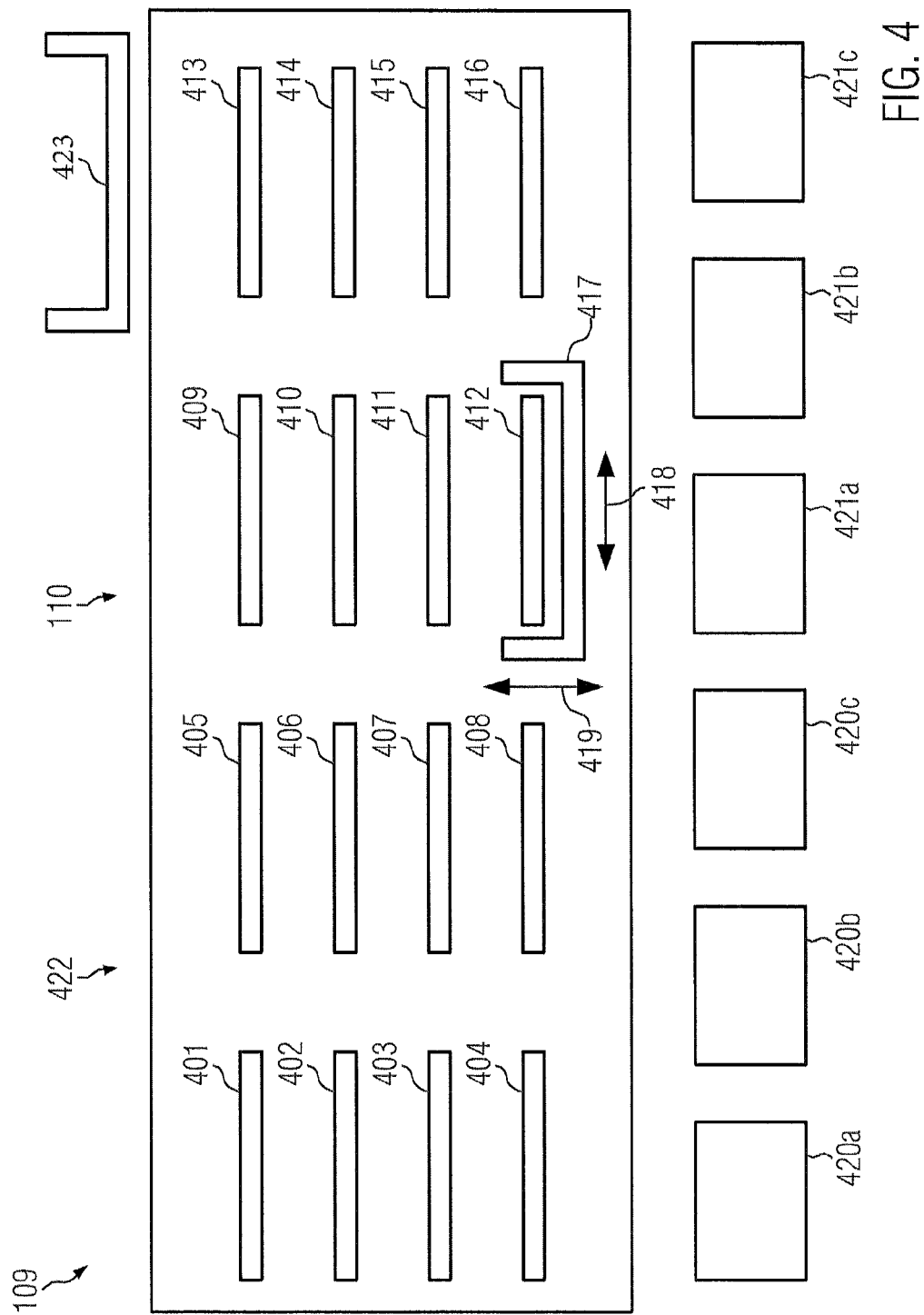
FIG. 4 schematically illustrates a buffer storage.

FIG. 3 shows a schematic view of tool 103*a*, being representative of a tool in one of the plurality of second equipments in the system 100 in an exemplary embodiment wherein tool 103*a* is a plasma enhanced chemical vapor deposition reactor. The tool 103*a* may include a carrier handler 301, which may be adapted for handling carriers having features corresponding to those of carrier 209 described above. The carrier handler 301 may receive one or more carriers through one or more input/output ports. In FIG. 4, reference numeral 420*a* denotes one input/output port of the tool 103*a*. However, the present disclosure is not limited to embodiments wherein the tool 103*a* has one input/output port. In other embodiments, the tool 103*a* may have two or more input/output ports. The tool 103*a* further includes a wafer storage elevator 303 and a wafer handler 304 which may be provided in a load lock 302. The wafer storage elevator 303 may receive wafers from carriers that are handled by the carrier handler 301, and may move the wafers into the load lock 302. The wafer handler 304 may move the wafers between a plurality of chambers 305, 306, 307, 308. The chambers 305 to 308 may be adapted for performing plasma enhanced chemical vapor deposition processes and/or processes that may be performed before or after a plasma enhanced chemical vapor deposition process such as, for example, processes of cleaning, etching, oxidation and/or annealing.

Equipment 104 which, as detailed above, may be an equipment of substantially the same or similar type as equipment 103 and optionally further second equipments in the system 100 may include one or more tools of the same or similar type as tool 103a, which may have features corresponding to those described above with reference to FIG. 3.

As detailed above, the present disclosure is not limited to embodiments wherein the second equipments 103, 104 include plasma enhanced chemical vapor deposition reactors. In other embodiments, the second equipments 103, 104 may include tools of a different type.

In some embodiments, equipments 103, 104 and, optionally, further second equipments of the same type as equipment 103 may be arranged relatively close to each other, for example adjacent each other. The first equipment 102, being an equipment of a different type than the second equipments 103, 104, may be arranged at a more distant location. However, the present disclosure is not limited to such embodiments. In other embodiments, the second equipments 103, 104 may be arranged at locations that are relatively distant from each other, and the first equipment 102 may be arranged relatively close to one of second equipments 103, 104.

FIG. 4 shows a schematic view of the buffer storages 109, 110 associated with the second equipments 103, 104 in an embodiment wherein the second equipments 103, 104 are arranged adjacent each other.

The buffer storages 109, 110, as well as the tools of the second equipments 103, 104, may be arranged in a tool bay 422 of a semiconductor factory. Each of the buffer storages 109, 110 may include a plurality of shelves. In FIG. 4, reference numerals 401 to 408 schematically denote shelves of the buffer storage 109 associated with the equipment 103, and reference numerals 409 to 416 schematically denote shelves of the buffer storage 110 associated with the equipment 104.

The shelves 401 to 408 of the buffer storage 109 may be arranged above input/output ports 420a, 420b, 420c of the tools 103a, 103b, 103c of the equipment 103, and the shelves 409 to 416 of the buffer storage 110 may be arranged above input/output ports 421a, 421b, 421c of the tools 104a, 104b, 104c of equipment 104. The buffer storage 108 may be mounted to a ceiling. Alternatively, it may be wall-mounted or free-standing.

Each of the shelves 401 to 416 of the buffer storages 109, 110 may support one or more carriers including lots of workpieces that are to be processed by tools 103, 104. For example, lot 114 (see FIG. 1) may be provided on one of shelves 401 to 408, and lots 115, 116, 117 (see FIG. 1) may be provided on one or more of shelves 409 to 410.

Reference numeral 417 denotes a robotic shuttle, being part of the automated material handling system 122. The shuttle 417 may be movable in horizontal directions 418 and vertical directions 419. The shuttle 417 may be movable to each of the shelves 401 to 416 of the buffer storages 109, 110 and to each of the input/output ports 420a, 420b, 420c, 421a, 421b, 421c of the tools 103a, 103b, 103c, 104a, 104b, 104c, and optional further input/output ports of the tools 103a, 103b, 103c (in embodiments wherein there are tools with more than one input/output port). The shuttle 417 may be adapted for moving carriers provided on any of the shelves 401 to 408 of the buffer storage 109 to the input/output ports 420a, 420b, 420c of the tools 103a, 103b, 103c and for moving carriers provided on any of the shelves 409 to 416 of the buffer storage 110 to the input/output ports 421a, 421b, 421c of the tools 104a, 104b, 104c. Additionally, the automated material handling system 122 may include another shuttle 423 that can move carriers including workpieces from any of the shelves 401 to 416 to other locations of the system 100. Moreover, in some embodiments, separate shuttles similar to shuttle 417 may be provided for buffer storage 109 and for buffer storage 110.

For handling the carriers, each of the shuttles 417, 423 may include a gripper. The operation of the shuttles 417, 423 may be controlled by the hosts 106, 107 and the data processing arrangement 101.

The buffer storage 108 of the equipment 102 may include shelves similar to those of buffer storages 109, 110 described above, and a robotic shuttle similar to shuttle 417 and/or another robotic shuttle similar to shuttle 423 may be used for moving carriers including lots of workpieces from the shelves of the buffer storage 108 to an input/output port of the tools 102a, 102b, 102c of the equipment 102 and for moving carriers including lots of workpieces from the input/output ports of the tools 102a, 102b, 102c of the equipment 102 to other locations of the system 100.

Figure 5:
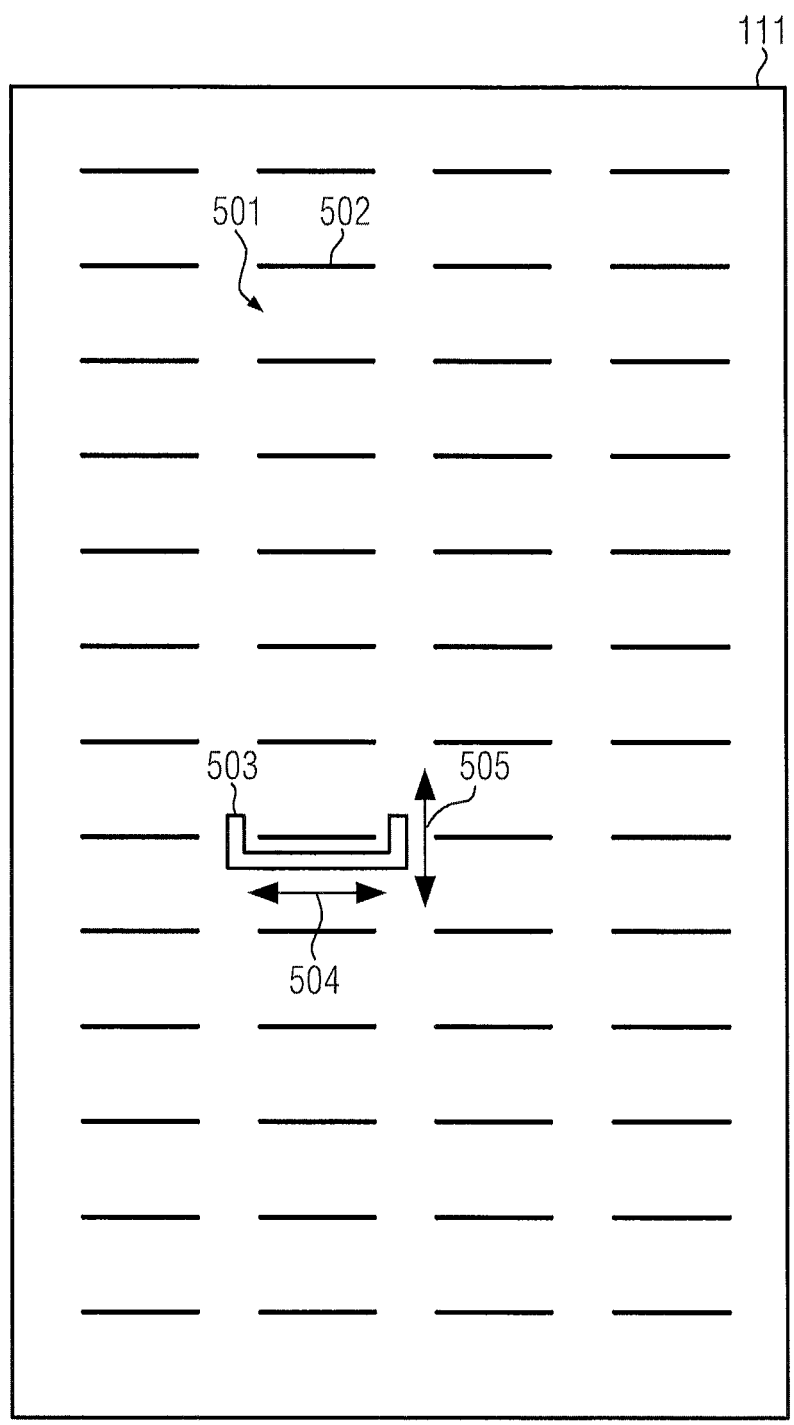
FIG. 5 schematically illustrates a bulk storage.

FIG. 5 shows a schematic view of the bulk storage 111 in an embodiment. The bulk storage 111 may include a plurality of shelves 501, wherein an exemplary shelf of the plurality of shelves 501 is denoted by reference numeral 502. Features of the shelves 501 of the bulk storage 111 may correspond to those of the shelves 401 to 416 of the buffer storages 109, 110. A robotic shuttle 503, having features corresponding to those of shuttle 417, may be used for inserting carriers including lots of workpieces into the shelves 501 of the bulk storage 111 and for removing carriers including lots of workpieces from the shelves 501. The shuttle 503 can be movable along the bulk storage 111 in horizontal directions 504 and vertical directions 505.

A storage space of the bulk storage 111 may be greater than a storage space of each of the buffer storages 108, 109, 110, so that the bulk storage 111 may store a greater number of carriers including lots of workpieces than each of the buffer storages 108, 109, 110. In some embodiments, a storage space of each of the buffer storages 108, 109, 110 may be less than about one-half of the storage space of the bulk storage 111, less than about one-fifth of the storage space of the bulk storage 111 and/or in a range from about one-tenth of the storage space of the bulk storage 111 to about one-fifth of the storage space of the bulk storage 111. Thus, in the operation of the system 100, a majority of all lots of workpieces that are currently not being processed by any of the equipments 102, 103, 104 of the system, and which are not currently being transported by the automated material handling system 122, may be stored in the bulk storage 111, and only a smaller fraction of the lots of workpieces which are not currently being processed or transported may be provided in the buffer storages 108, 109, 110.

The storage space of each of the buffer storages 108, 109, 110 may be adapted such that it is sufficient to store a number of lots of workpieces that is equal to or greater than a maximum number of lots that may be processed by the one of the equipments 102, 103, 104 associated with the respective one of the buffer storages 108, 109, 110 during a predetermined delay buffer time. The delay buffer time may be selected in accordance with typical delays that may occur in the transport of lots of workpieces by means of the automated material handling system 122, so as to substantially avoid or at least reduce a likelihood of idle times of the equipments 102, 103, 104 that are caused by a late delivery of lots of workpieces to be processed by the equipments 102, 103, 104. In some embodiments, the delay buffer time may be in a range from about 5 minutes to about 1 hour. The present disclosure is not limited to embodiments wherein each of the buffer storages 108, 109, 110 is arranged such that lots of workpieces stored in the buffer storages 108, 109, 110 are arranged above input/output ports of the tools of the equipments 102, 103, 104. In other embodiments, a different relative arrangement of the buffer storages 108, 109, 110 relative to the tools of the equipments 102, 103, 104 may be provided. For example, buffer storage 108 may be arranged at the side of the tools of the equipment 102, buffer storage 109 may be arranged at the side of the tools of the equipment 103, and buffer storage 110 may be arranged at the side of the tools of the equipment 104.

Generally, the buffer storage 108 may be arranged closer to the equipment 102 than the bulk storage 111, the buffer storage 109 may be arranged closer to the equipment 103 than the bulk storage 111, and the buffer storage 110 may be arranged closer to the equipment 104 than the bulk storage 111.

The bulk storage 111 may be arranged closer to the first equipment 102 than the buffer storages 109, 110 associated with the second equipments 103, 104. For example, the bulk storage 111 may be associated with a bay wherein the first equipment 102 is provided, the second equipments 103, 104 being arranged in a different bay of the system 100.

In the following, methods that may be used for operating the system 100 described above with respect to FIGS. 1-5 will be described with respect to FIGS. 6-9.

Figure 6:
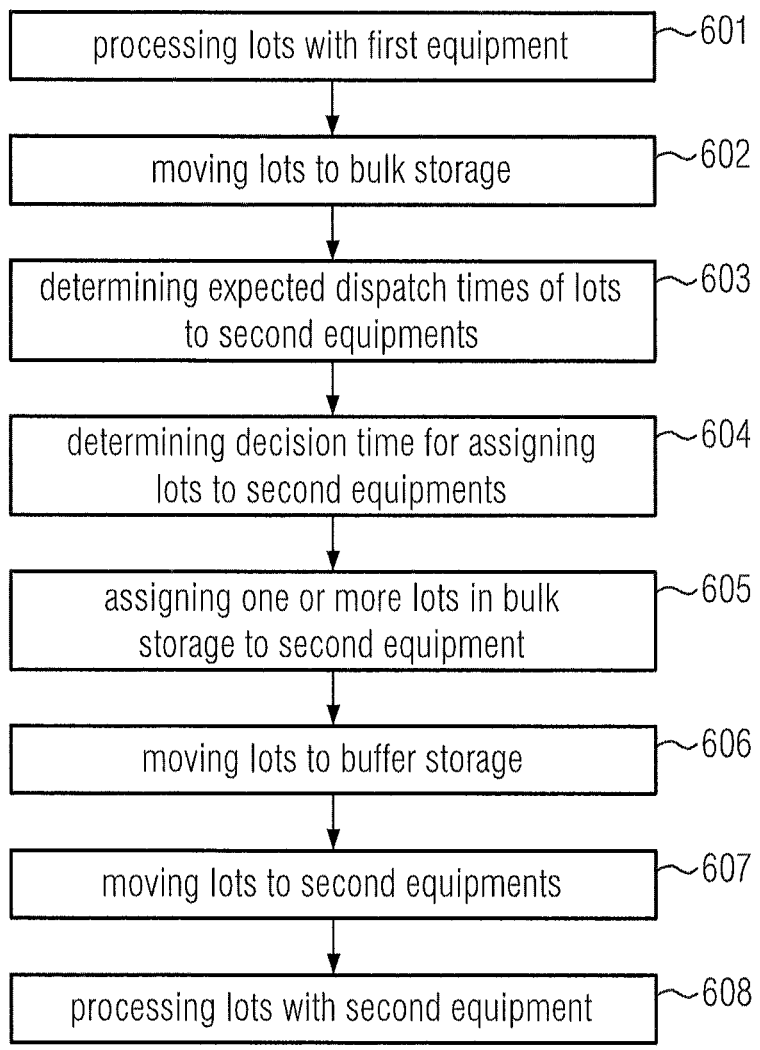
FIG. 6 shows a flow diagram illustrating steps of a method according to an embodiment.

FIG. 6 shows a flow diagram of a method according to an embodiment. For performing the method, the data processing arrangement 101 may control the equipments 102, 103, 104 and the automated material handling system 122 by sending signals to and receiving signals from the hosts 105, 106, 107 of the equipments 102, 103, 104 and the automated material handling system 122 through the network 125.

At step 601, a lot of workpieces, in particular a lot of semiconductor wafers, may be processed with the first equipment 102. For this purpose, a lot of workpieces in the buffer storage 108 associated with the first equipment 102, for example the lot 112, may be moved to an input/output port of a tool of the equipment 102 by the automated material handling system 122. Then, one or more processing steps, for example one or more processing steps of a semiconductor manufacturing process, are performed for each of the wafers of the lot 112. For example, in embodiments wherein the first equipment is adapted to perform an ion implantation process, ions may be implanted into the wafers of the lot 112. Thereafter, the lot 112 may be output through the input/output port of the first equipment 102.

Then, at step 602, the lot 112 may be moved to the bulk storage 111. This may be done by the automated material handling system 122, the operation of which may be controlled by the data processing arrangement 101.

Additionally, further lots of workpieces may be processed by the first equipment 102. For example, the lot 113 may be moved from the buffer storage 108 to the input/output port of the first equipment 102. Then, for each of the wafers of the lot 113, the one or more processing steps may be performed. Thereafter, the lot 113 may be output by the equipment 102 through its input/output port, and the lot 113 may be moved to the bulk storage 111 by the automated material handling system 122.

The present disclosure is not limited to embodiments wherein all the lots processed by the first equipment 102 are moved to the bulk storage 111. In some embodiments, a part of the lots processed by the first equipment 102 may be moved directly to one of the buffer storages 109, 110 of the second equipments 103, 104.

At a step 603, an expected dispatch time for one or more next lots for processing by the second equipment 103 may be determined, wherein the expected dispatch time is a point in time in the future at which one or more lots are to be dispatched to the second equipment 103 if the one or more lots are to be processed by the second equipment 103 substantially without there being an idle time of the second equipment 103 during which the second equipment 103 is waiting for a lot. For example, the expected dispatch time may be a point in time at which the movement of one or more lots of workpieces from the bulk storage 111 to the buffer storage 109 associated with the second equipment 103 by the automated material handling system 122 is to be started, or a point in time at which the automated material handling system 122 is to be activated for moving one or more lots from the bulk storage 111 to the buffer storage 109. Additionally, an expected dispatch time of one or more next lots for processing by the second equipment 104 may be determined. Features of the expected dispatch time of one of more next lots for processing by the second equipment 104 may correspond to those of the expected dispatch time of one or more next lots for processing by the second equipment 103.

In some embodiments, the expected dispatch times may be determined on the basis of an expected process end time of the second equipments 103, 104. A duration of a time interval between the expected dispatch time and the expected process end time may be selected on the basis of an approximate transport time of the one or more next lots from the bulk storage to the respective second equipment, and a buffer time of the next lot in the buffer storage associated with the second equipment, which may be determined on the basis of a number of lots currently in the buffer storage. In some embodiments, the time interval between the expected process end time and the expected dispatch time may be in a range from about 0 seconds to about 6 hours, corresponding to the processing time of a fully loaded tool.

Further methods for determining the expected dispatch times according to embodiments will be described below. The determination of the expected dispatch times may be performed by the just-in-time module 123. At step 604, for each of the second equipments 103, 104, a decision time at which at least one of the lots in the bulk storage 111 is assigned to the respective second equipment 103, 104 may be determined on the basis of the dispatch time determined for the respective second equipment 103, 104. This may be done by the just-in-time module 123. The decision time for the second equipment 103 may be selected such that it is approximately equal to the expected dispatch time at which a next lot will be dispatched to the second equipment 103.

Similarly, a decision time for assigning one or more lots to the second equipment 104 may be determined. The decision time for assigning one or more lots to the second equipment 104 may be determined on the basis of the expected dispatch time of one or more next lots to the second equipment 104, similar to the determination of the decision time for assigning one or more lots to the equipment 103.

The determination of the expected dispatch times of lots to the second equipments 103, 104 and the determination of the decision times for assigning lots to the second equipments 103, 104 need not be performed after the processing of lots with the first equipment 102 and the moving of lots from the first equipment 102 to the bulk storage 111. In other embodiments, the determination of the expected dispatch times and the determination of decision times may be performed before the processing of lots with the first equipment 102 and/or before moving lots from the first equipment 102 to the bulk storage 111 and/or substantially simultaneously to the processing of lots with the first equipment 102 and/or the moving of lots from the first equipment 102 to the bulk storage 111.

At step 605, one or more lots in the bulk storage 111, which may include the lot 112 and/or the lot 113 processed by the first equipment 102, may be assigned to the second equipments 103, 104 by the just-in-time module 123. The assignment of one or more lots to one of the second equipments 103, 104 may be performed at the decision time of the respective second equipment that was determined in step 604. In particular, the assignment of one or more lots to the second equipment 103 may be performed substantially at the decision time determined for the second equipment 103, and the assignment of one or more lots to the second equipment 104 may be performed at the decision time determined for the second equipment 104.

Thus, the assignment of one or more lots to the second equipment 103 and the assignment of one or more lots to the second equipment 104 need not be performed simultaneously. The assignment of lots to the second equipments 103, 104 may be based on the expected dispatch times of the next lots that will be dispatched to the second equipments 103, 104. Additionally, the assignment of lots to the equipments 103, 104 may be based on priorities of the lots, utilization and status of the bulk storage 111, as well as utilization and status of the buffer storages 109, 110 of the second equipments 103, 104. For example, if the number of lots in one of the buffer storages 109, 110 becomes less than a predetermined threshold value, lots may be preferentially assigned to the second equipment associated with this buffer storage to reduce the likelihood that the respective equipment becomes idle.

Further criteria that may be considered in the assignment of lots in the bulk storage 111 to the second equipments 103, 104 in some embodiments may include queue time requirements. A queue time requirement may define a maximum time interval between two subsequent steps of a semiconductor manufacturing process. For example, in some embodiments, a queue time requirement may define that a time interval between a formation of a gate insulation layer and a formation of a gate electrode on the gate insulation layer may not exceed a predetermined time limit.

Additionally, in some embodiments, in the assignment of lots of workpieces to the second equipments 103, 104, an availability of purge nests in the bulk storage 111 and/or in the buffer storages 109, 110 may be considered. Purge nests may be provided in the bulk storage 111 and/or in the buffer storages 109, 110 for supplying a purge gas to pods including carriers wherein lots of workpieces are provided for removing moisture from the pods. In other embodiments, vacuum sources for creating a vacuum in the pods may be provided in addition to purge nests. An availability of vacuum sources may be considered in the assignment of lots of workpieces to the second equipments 103, 104.

Moreover, in some embodiments, further constraints of the manufacturing process, for example constraints related to an availability of bottleneck tools and/or lot preferences, may be considered in the assignment of lots to the second equipments 103, 104. Further constraints of the manufacturing process considered in the assignment of lots to the second equipments 103, 104 may correspond to those of conventional approaches for assigning lots of semiconductor wafers to equipments in the manufacturing of semiconductor devices.

In some embodiments, the data processing device 101 may maintain a queue for the lots of workpieces in the bulk storage 111. The queue in the data processing device 101 may be a data structure provided in a memory of the data processing device 101 that defines an order of the lots of workpieces in the bulk storage 111. In some embodiments, the queue for the lots of workpieces in the bulk storage 111 may be provided by the just-in-time module 123.

When a lot of workpieces is moved to the bulk storage 111, the lot may be appended to the end of the queue, for example, by including data representative of the lot into the data structure representing the queue. When one or more lots from the bulk storage 111 are assigned to the second equipment 103 and/or the second equipment 104, data representative of lots in the bulk storage 111 at the beginning of the queue may be read, and the lots of workpieces represented by the data may be assigned to second equipment 103 and/or the second equipment 104. Thereafter, the data representative of the lots assigned to the second equipment 103 and/or the second equipment 104 may be removed from the queue. Thus, generally, lots of workpieces in the bulk storage 111 may move forward in the queue, until they arrive at the beginning of the queue and are assigned to one of the second equipments 103, 104 which are suitable for performing a next step of the manufacturing process of the workpieces of the lot.

However, the queue need not be handled in a strictly first in, first out manner. In some embodiments, queue reordering processes may be performed. At a decision time when one or more lots are assigned to one or more of the second equipments 103, 104, the just-in-time module 123 can query the real-time dispatcher module 124 if there is a need to reorder the queue of lots of workpieces in the bulk storage 111. The real-time dispatcher module 124 may then decide if the queue is to be reordered. The decision may be based on the priority of lots of workpieces represented in the queue. For example, lots of workpieces having a higher priority may be moved forward in the queue, whereas lots having a lower priority may be moved backward. Furthermore, the reordering of the queue may be based on queue time requirements. For example, lots of workpieces that have been stored in the bulk storage 111 for a substantial amount of a maximum allowable queue time, for example, more than two-thirds, more than three-fourths and/or more than ninety percent of the maximum allowable queue time, or lots wherein an amount of time until the expiry of the maximum allowable queue time is less than a predetermined value of, for example, about 30 minutes, may be moved forward in the queue. Additionally, the reordering of the lots of workpieces in the queue may be performed on the basis of the availability of purge nests and further constraints, as detailed above.

After the reordering of the queue, one or more lots of workpieces may be assigned to the second equipment 103 and/or the second equipment 104.

As detailed above, the assignment of lots of workpieces to one of the second equipments 103, 104 may be performed at a decision time, which is a relatively short time before the dispatch time at which the lots are dispatched. By reordering the queue of lots of workpieces at the decision time, the decision as to which of the lots of workpieces in the bulk storage 111 are assigned to equipment 103 and/or equipment 104 can take changes of circumstances, such as, for example, changing lot priorities that have occurred between the time at which lots of workpieces in the bulk storage 111 were processed by the first equipment 102 and were moved to the bulk storage 111 and the point in time at which lots of workpieces are dispatched to the second equipment 103 and/or the second equipment 104, into account.

At step 606, a lot of workpieces that was assigned to the second equipment 103 in step 605 may be dispatched and moved to the buffer storage 109 associated with the second equipment 103 and/or a lot of workpieces that was assigned to the second equipment 104 in step 605 may be dispatched and moved to the buffer storage 110 associated with the second equipment 104.

The movement of lots of workpieces from the bulk storage 111 to the buffer storages 109, 110 associated with the second equipments 103, 104 may be performed by the automated material handling system 122, wherein the operation of the automated material handling system 122 may be controlled by the data processing arrangement 101.

At step 607, one or more of the lots of workpieces in the buffer storage 109 associated with the second equipment 103 may be moved to the second equipment 103 and may be processed (step 608) by one or more of the tools 103a, 103b, 103c of the second equipment 103. Lots of workpieces from the buffer storage 110 associated with the second equipment 104 may be moved from the buffer storage 110 to the second equipment 104 and may be processed by one or more of the tools 104a, 104b, 104c of the second equipment 104. In some embodiments, the movement of the lots may be performed by the automated material handling system 122 under control of one of the hosts 106, 107 associated with the respective one of the second equipments 103, 104. When one of the lots of workpieces in the buffer storage 109 is moved to one of the tools 103a, 103b, 103c of the second equipment 103 for processing of the lot by the respective tool, the lot of workpieces may be selected from all of the lots of workpieces in the buffer storage 109. This selection may be performed by means of a queue including data representative of the lots of workpieces in the buffer storage 109, similar to the queue including data representative of the lots of workpieces in the bulk storage 111 that may be used for assigning lots of workpieces to the second equipments 103, 104 as described above. A reordering of the queue may be performed, similar to the reordering of the queue for the lots in the bulk storage 111 described above. Thus, changing priorities of the lots of workpieces in the buffer storage 109 as well as other changes of circumstances may be considered. Maintaining the queue of the lots of workpieces in the buffer storage 109, reordering the queue and selecting a lot of workpieces on the basis of the queue may be performed by the just-in-time module 123 of the data processing arrangement 101 or by the host 106 of the equipment 103. In some embodiments, the real-time dispatcher module 124 may be queried for reordering the queue.

Similarly, a queue may be provided for the lots of workpieces in the buffer storage 110 associated with the equipment 104, and a reordering of the queue as well as a selection of lots of workpieces for processing by the equipment 104 may be performed.

In the following, embodiments will be described with reference to FIGS. 7-9, which may be employed, in particular, for scheduling lots of workpieces in the buffer storages 109 and 110, respectively, for processing by means of the tools 103a, 103b, 103c of the second equipment 103 or the tools 104a, 104b, 104c of the second equipment 104, respectively, and which may be used for performing steps 607, 608 described above.

As will be detailed below, features of methods described in the following, which include determining an expected dispatch time, may, in some embodiments, correspondingly be applied for determining an expected dispatch time in step 603 described above with respect to FIG. 6.

However, the following description is not limited to embodiments wherein a bulk storage and buffer storages associated with individual tools are used, and wherein lots of workpieces that have been processed by a first equipment and are to be processed by a second equipment are first moved to the bulk storage, then to the buffer storage associated with a second equipment, and thereafter from the buffer storage to the second tool associated with the buffer storage.

In some embodiments, either the bulk storage 111 or the buffer storages 108, 109, 110 may be omitted, and lots of workpieces may be moved from a first equipment wherein a first step of a manufacturing process is performed, for example equipment 102 as described above with reference to FIG. 1, to a second equipment wherein a second step of the manufacturing process is performed, for example one of equipments 103, 104 as described above with reference to FIG. 1, by means of only two moves of the automated material handling system 122.

For example, in embodiments wherein the buffer storages 108, 109, 110 are omitted, lots of workpieces that have been processed by the first equipment 102 may be moved to the bulk storage 111 and, after assignment to one of the second equipments 103, 104, the lots of workpieces may be directly moved from the bulk storage 111 to the respective one of the second equipments 103, 104.

In embodiments wherein the bulk storage 111 is omitted, the buffer storage 108 associated with the first equipment 102 may be used for storing lots of workpieces that have been processed by the first equipment 102. When one of the lots of workpieces that have been processed by the first equipment 102 is assigned to one of the second equipments 103, 104 for performing further processing steps, the one or more lots of workpieces may be moved from the buffer storage 108 to the one of the second equipments 103, 104 to which the one or more lots of workpieces were assigned. After processing the lots of workpieces by the one of the second equipments 103, 104, they may be moved to the one of the buffer storages 109, 110 associated with the respective second equipment, until they are dispatched to a third equipment for subsequent processing steps. In such embodiments, the buffer storages 108, 109, 110 may have a relatively high storage capacity, so that, although the bulk storage 111 is omitted, the buffer storages 108, 109, 110 provide sufficient storage capacity.

Generally, the expected dispatch time of one or more next lots for processing by a tool may be a point in time in the future at which a movement of one or more lots to the tool is to be started if the one or more lots are to be processed by the tool substantially without there being an idle time of the tool during which the tool is waiting for a lot.

Figure 7:
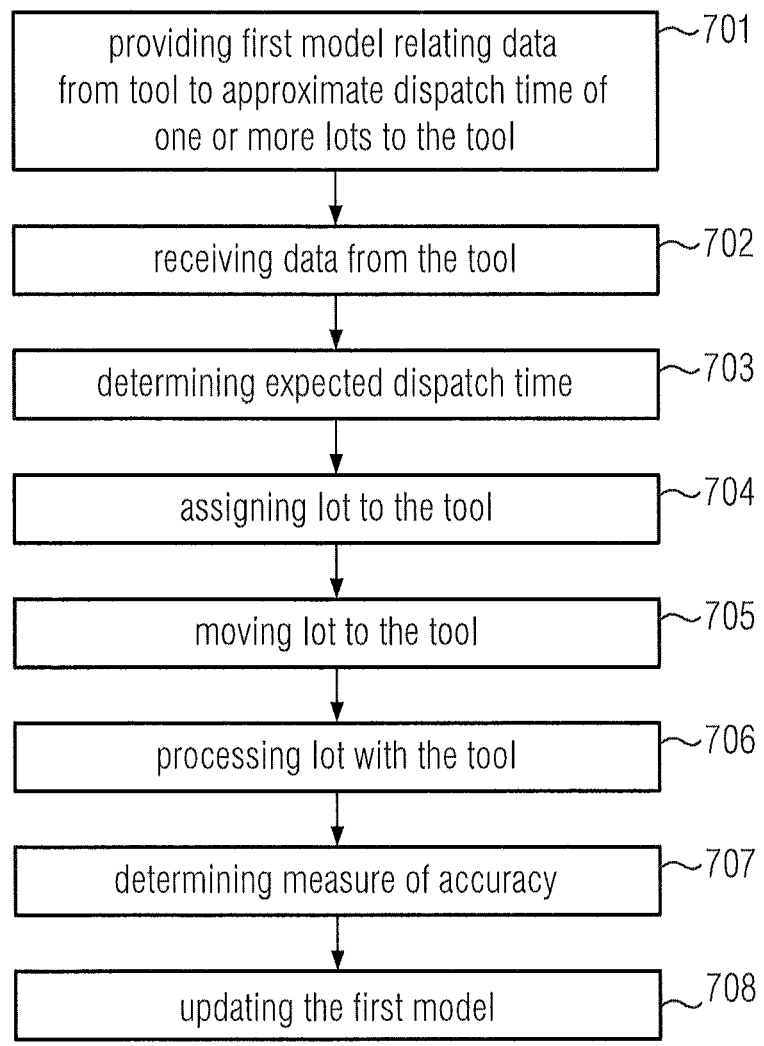
FIG. 7 shows a flow diagram illustrating steps of a method according to an embodiment.

At step 701 illustrated in FIG. 7, a first model relating at least data from a tool to an expected dispatch time of one or more next lots processed by the tool is provided. The tool can be one of the tools 102a, 102b, 102c, 103a, 103b, 103c, 104a, 104b, 104c described above with respect to FIG. 1, in particular one of the second tools 103a, 103b, 103c, 104a, 104b, 104c. In the following, for simplicity, reference will be made to tool 103a, wherein it is to be understood that corresponding considerations apply to tools 102a, 102b, 102c, 103b, 103c, 104a, 104b, 104c. The model may be provided by the one of the hosts 105, 106, 107 associated with the respective tool, for example host 106 in the case of tool 103a.

The tool 103a may include one or more stations. At each of the stations, one or more steps of a manufacturing process, in particular one or more steps of a semiconductor manufacturing process, may be performed.

For example, in the embodiment described above with reference to FIG. 3, wherein the tool 103a is a plasma enhanced chemical vapor deposition reactor, each of the chambers 305 to 308 of the tool 103a may provide one of the stations of the tool. In each of the chambers 305 to 308, one or more steps of the manufacturing process may be performed, as detailed above.

In other embodiments, two or more of the chambers 305 to 308 of the tool 103a may be combined into one station of the tool. In such embodiments, each of the chambers of one station may be used for performing the same one or more steps of the manufacturing process, and the workpieces of a lot processed by the tool 103a may be distributed over the chambers of the station for performing these one or more steps of the manufacturing process.

The present disclosure is not limited to embodiments wherein each of the tools 102a, 102b, 102c, 103a, 103b, 103c, 104a, 104b, 104c has a plurality of stations. In some embodiments, one or more of the tools 102a, 102b, 102c, 103a, 103b, 103c, 104a, 104b, 104c may include only a single station.

The data from the tool 103a used by the first model may be provided by the host 106 of the tool 103a. The data may be obtained in the processing of lots of workpieces that are currently being processed by the tool 103a and/or or in the processing of lots of workpieces, whose processing by the tool 103a has already been completed. Accordingly, the lots of workpieces during the processing of which the data from the tool 103a are obtained may be different from lots of workpieces in the bulk storage 111 and/or the buffer storage 109 that might possibly be assigned to the tool 103a for processing in the future, or have already been assigned to the tool 103a.

In some embodiments, the data from the tool 103a may include a time taken by each of a plurality of wafers of one or more lots to move from at least one carrier to a first one of the stations of the tool 103a. For example, in the embodiment described above with reference to FIG. 3, this time may be a time taken by each of the wafers to move from carrier 209 in carrier handler 301 to a first one of the chambers 305 to 308, for example chamber 305.

The data may further include a time taken by each of the wafers of the one or more lots to move from a last one of the plurality of stations back to the at least one carrier. In the embodiment described above with reference to FIG. 3, this time may be a time taken by the wafers to move from a last one of the chambers 305 to 308, for example chamber 308, back to the carrier 209.

Additionally, the data may include a time taken by each of the wafers of the one or more lots at each of the plurality of stations of the tool 103a. In embodiments wherein each of the chambers 305 to 308 provides a station of the tool 103a, this may be a time taken by each of the wafers at each of the chambers 305 to 308. In embodiments wherein there is a station of the tool 103a that includes two or more of the chambers 305 to 308, the time taken by each wafer at the one of the chambers of the stations wherein it was processed or is currently being processed may be returned as the time taken by the wafer at the station.

Furthermore, the data may include a number of wafers that are currently in the tool 103a. In embodiments wherein the tool 103a is a deep tool, the data described above may be processed to create patterns of times when the tool 103a is empty, semi-loaded and/or fully loaded. A "deep tool" is to be understood as a tool having a relatively large number of chambers, but wherein processing in each chamber takes a relatively short time. An example of a deep tool is a tool with 60 chambers, wherein a processing time in one chamber is about 20 seconds, but in total for all chambers 20 minutes. In deep tools, multiple lots may be processed simultaneously in different stations.

The processing may be performed by the host 106 and/or the just-in-time module 123.

The data may further include a distribution of wafer loading in the tool 103a which may, for example, be provided in the form of a number of wafers that are currently in each of the chambers 305 to 308 and/or numbers of wafers that were in each of the chambers 305 to 308 in the past.

The data from the tool 103a may further include a processing time per wafer of one or more lots related to process steps. This time may be different from the time taken by each of the wafers of the one or more lots at each of the stations described above, in particular in embodiments wherein different steps of a process recipe are performed at one station and/or in embodiments wherein one of the stations may be used for carrying out different processing steps. For example, in embodiments wherein the tool 103a is a plasma enhanced chemical vapor deposition reactor as described above with reference to FIG. 3, this time may be, for example, a processing time per wafer used for a specific plasma enhanced chemical vapor deposition step wherein a particular combination of parameters such as flow of reactant gases, pressure in the respective one of the chambers 305 to 308 of the tool 103a, temperature and/or plasma power is used.

The data may further include a time taken by each of at least one carrier that is used for transporting the one or more lots, for example the carrier 209 illustrated in FIGS. 2 and 3, to perform at least one of docking the carrier 209, undocking the carrier 209, scanning a wafer map of the carrier 209, receiving a process recipe for the processing of the one or more lots, for example from a database stored in the data processing arrangement 101, and creating a job for processing the one or more lots at the host 106 of the tool 103a.

The data may further include a time taken by each of the at least one carrier, for example carrier 209 illustrated in FIG. 3, to complete after a last one of the wafers of the one or more lots associated with the carrier has returned to the carrier after processing.

The data may further include information relating to correlations between wafers processed by the tool 103a at different times. For example, this information may include information relating to correlations between material running before, after or in conjunction with wafers processed by the tool 103a. The information may specify if the wafers processed by the tool 103a at different times include semiconductor devices of the same type in the same stage of the manufacturing process, or if the tool has been used for processing of wafers including different types of semiconductor devices and/or for performing different steps of the manufacturing process.

Furthermore, the data from the tool 103a may include historical states of the tool 103a such as, for example, a standby time since a last preventive maintenance, a productive time since the last preventive maintenance and the total time since the last preventive maintenance.

Furthermore, the data from the tool 103a may include one or more paths of the wafers of the one or more lots through the stations of the tool 103a related to a process recipe. The path may be a sequence of locations in the tool 103a traversed by a wafer that is or has been processed by the tool 103a. For example, the path of a wafer may start at the carrier 209 in the carrier handler 301. Then, the wafer may move into the wafer storage elevator 303 in the load lock 302. Thereafter, the wafer may move to the wafer handler 304, may perform a sequence of movements between the wafer handler 304 and one or more of the chambers 305 to 308, may move back to the wafer storage elevator 303, and may then move back to the carrier 209.

The path of the wafer through the tool 103a may depend on the particular process recipe of the processing of the wafer by the tool 103a. For example, if the wafer is part of a lot wherein the tool 103a is used for performing processing steps for depositing a layer of silicon dioxide, the path of the wafer through the tool 103a may be different from that of a wafer of a lot wherein the tool 103a is used for depositing a layer of silicon nitride. The path of wafers through the tool 103a with respect to process recipes may be obtained either from a wafer flow body of a recipe specifying a sequencing of the wafer through the tool 103a when the recipe is carried out, or the path related to process recipe may be obtained by correlating a name of the process recipe with the paths of wafers in the tool 103a.

Further data from the tool 103a that may be used in the model may include states of one or more lots in the buffer storage 109 associated with the tool 103a, for example intermediate states of the manufacturing processes that are performed at the wafers of the lots in the buffer storage 109 for manufacturing integrated circuits from the wafers.

The data from the tool 103a need not include all of the data described above. In some embodiments, only a part of the above-described data may be provided and/or other data may be provided.

The present disclosure is not limited to embodiments wherein the data used for the first model include only data from the tool 103a. In some embodiments, in addition to data from the tool 103a, data from the automated material handling system 122 may be used.

The data from the automated material handling system 122 may include a time taken by the automated material handling system 122 to move carriers including lots of workpieces that are currently being processed by the tool 103a or have been processed by the tool 103a in the past from a first location to a second location. For example, the data may include times for moving carriers including lots of workpieces from the bulk storage 111 to the buffer storage 109 and times for moving carriers including lots of workpieces from the buffer storage 109 to the tool 103a. The times may include times of movement of one or more vehicles and/or robots of the automated material handling system 122 such as, for example, the shuttles 417, 503 described above with reference to FIGS. 4 and 5 for transporting the carriers, and/or times for moving an empty vehicle and/or robot to a position where it receives a carrier.

Additionally, the data from the automated material handling system 122 may include a time taken by the automated material handling system 122, in particular a time taken by a vehicle and/or robot of the automated material handling system 122, to pick up carriers including lots of workpieces and/or a time to deliver carriers including lots of workpieces, wherein the lots of workpieces are currently being processed by the tool 103a and/or have been processed by the tool 103a in the past.

Additionally, the data from the tool 103a may include information about chemicals, temperatures, pressure, wafer counters, alarms and further data conventionally provided by semiconductor processing tools.

In addition to data from the tool 103a and/or the automated material handling system 122, the data used by the first model may include data from other components of the system 100, for example data from other tools of substantially the same or similar type as tool 103a, such as tool 104. The data received from the other tools may have features corresponding to those of the data from the tool 103a described above.

In some embodiments, the first model may be a data mining model that is formed on the basis of statistical patterns identified in the above-described data from the tool 103a and/or from other components of the system 100 such as the automated material handling system 122 and/or other tools.

For forming a data mining model, a plurality of data sets including data as described above may be collected. In some embodiments, each data set may include data as described above, collected at one of a plurality of points in time. For example, the just-in-time module 123 of the data processing arrangement may receive data as described above at regular time intervals.

Statistical techniques, for example techniques from multivariate statistics, may be employed for identifying correlations between different data sets from the plurality of data sets. The first model may be provided on the basis of the identified correlations so as to at least approximately predict the expected dispatch time at which one or more next lots are to be sent to the tool 103a by matching patterns between current data received from the tool 103a and/or other components of the system 100, such as the automated material handling system 122 and/or tools other than tool 103a, and correlating data that have been obtained in the past.

For providing the first model, techniques of classification, clustering, associative learning and/or multiparameter regression that are applied to accumulated data obtained from the tool 103a and/or tools of substantially the same or similar type such as the tool 104 may be used.

In some embodiments, for providing the first model, from the above-described data from the tool 103a, parameters or combinations of parameters which may be particularly relevant for determining expected dispatch times can be identified. This may be done by means of statistical techniques such as classification, clustering, association rule learning and/or principal component analysis. Thus, a number of parameters can be reduced.

After this reduction of the number of parameters, one or more multi-parameter regressions, for example one or more multiple linear regressions, can be calculated on a data horizon, for example a rolling data horizon, to minimize differences between calculated and actual processing times and/or transport times of lots. The expected dispatch time may then be obtained on the basis of the calculated processing and transporting times, for example by subtracting a calculated transporting time from an expected process end time that can be obtained from the one or more calculated processing times and a current time.

In other embodiments, the first model may be a state machine model. A state machine, sometimes also denoted as a finite state machine, is a mathematical model of an abstract machine that can be in one of a finite number of states. Typically, the machine is in only one state at a time, wherein the state at any given time is called the current state. The state machine can change from one state to another when initiated by a triggering event or condition, which is called a transition. A state machine can be defined by a list of its states and the triggering condition for each transition.

For using a state machine model for relating the data from the tool 103a to an expected dispatch time of one or more next lots processed by the tool 103a, the states of the abstract machine may be identified with wafer positions in different parts of the tool 103a, in particular stations of the tool 103a, which are traversed by the wafer when the wafer moves on its path through the tool 103a and is processed in accordance with a particular process recipe. In some embodiments, the above-described data relating to paths of wafers through the tool 103a determined above may be used for providing the state machine model.

Additionally, the state machine model can take tool states, such as processing, idle, last recipe, wafer flows through the tool 103a, alarms and other data obtained from the tool 103a as described above, into account for answering the question if now to dispatch or not. In some embodiments, the first model may include a combination of a data mining model and a state machine model. The data mining model of the combination model may have features corresponding to those of the data mining model described above, and the state machine model of the combination model may have features corresponding to those of the state machine model described above. For providing the data mining model and the state machine model, techniques as described above may be employed.

Further referring to FIG. 7, at step 702, data as described above are received from the tool 103a and/or other components of the system 100, such as the automated material handling system 122 and/or tools other than the tool 103a. This may be done by the host 106, for example by a local just-in-time model provided in the host 106.

The host 106 can send a signal to the tool 103a and, optionally, to other tools, and can request a transmission of data. In response to the signal, the tools send a signal including data as described above to the host 106. In some embodiments, the host 106 can receive the data substantially in real-time.

Additionally, the host 106 can send a signal to the automated material handling system 122, for example to a computer configured to control the operation of the automated material handling system 122, and, in response to the receipt of the signal, the automated material handling system 122 can send data as described above to the host 106.

At step 703, the first model and the received data may be used by the host 106 to determine the expected dispatch time of the one or more next lots for processing by the tool. In embodiments wherein the first model is a data mining model, matching patterns between the received data and correlating data from history may be determined, and the expected dispatch time may be determined on the basis of the historical data.

In embodiments wherein the first model is a state machine model, the received data may be utilized in real-time to estimate the flow of wafers through the tool 103a and to predict therefrom when the tool 103a is available for receiving the next lot. The expected dispatch time may be calculated from this time and from an estimate of the time required by the automated material handling system to move the next lot to the tool 103a.

Figure 8:
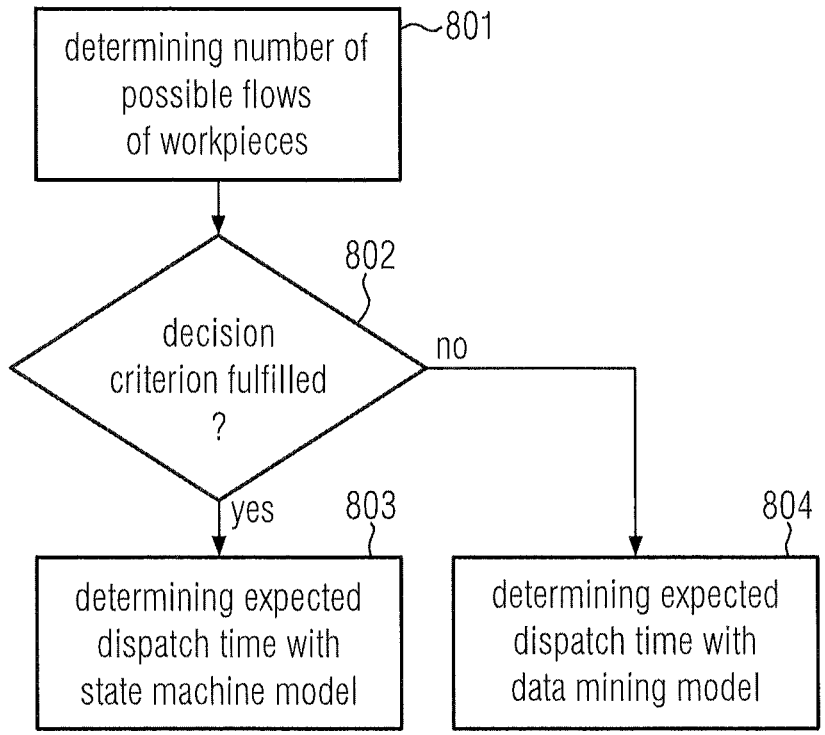
FIG. 8 shows a flow diagram illustrating steps of a method according to an embodiment.

In embodiments wherein the first model is a combination model including a data mining model and a state machine model, the determination of the expected dispatch time may be performed in accordance with the flow diagram shown in FIG. 8.

In some embodiments, at step 801, a number of possible flows of workpieces through the tool 103a is determined. The number of possible flows of workpieces may be determined from a number of combinations and/or permutations of steps and/or substeps of a manufacturing process performed by the tool 103a.

For example, in the embodiment of tool 103a described above with reference to FIG. 3, there may be different possibilities for performing steps of a plasma enhanced chemical vapor deposition process, a step of depositing a material layer on a semiconductor wafer, or another step performed by means of the tool 103a, for example a step of cleaning, etching and/or annealing, may be performed in more than one manner. For example, more than one of the chambers 305 to 308 may be available for performing the respective step. Moreover, a wafer that is first processed in a first one of the chambers 305 to 308, and then in a second one of the chambers 305 to 308 may be moved directly from the first chamber to the second chamber by the wafer handler 304, or the wafer handler 304 may first put the wafer to a storage location within the tool 103a, for example in the load lock 302 or in an otherwise unused one of the chambers 305 to 308, and pick it up at a later point in time for moving it to the second chamber. The number of possible flows of workpieces may be determined on the basis of a number of combinations and/or permutations of the different possibilities for performing a particular type of work by means of the tool 103a.

At step 802, it is determined if a decision criterion is fulfilled. In some embodiments, determining if the decision criterion is fulfilled may include determining if the number of possible flows of the workpieces of a lot processed by the tool 103a through the tool 103a is less than a threshold value.

If the number of possible flows of workpieces is less than the threshold value, the decision criterion is fulfilled, and processing is continued at step 803, wherein the expected dispatch time is determined using the state machine model of the combination model. If the number of possible flows of workpieces through the tool 103a is greater than the threshold value, processing is continued at step 804 and the expected dispatch time is determined with the data mining model. The threshold value may be selected in accordance with the computational power required for determining the expected dispatch time by means of the state machine model. While using the state machine model may provide a greater accuracy of the estimated dispatch times, the use of the state machine model may require a high computational power if the number of possible flows of workpieces through the tool 103a is large. Using the data mining mode, if the number of possible flows of workpieces through the tool 103a is large, may, thus, help to reduce the computational power required for calculating the expected dispatch time.

In other embodiments, step 801 may be omitted, and the decision criterion may be based on a prediction accuracy of the state machine model and the data mining model. In such embodiments, it may be monitored if the state machine model or the data mining model provide more accurate results, for example on the basis of the measure of accuracy described below, and the one of the state machine model and the data mining model providing a greater degree of accuracy may be used.

Referring to FIG. 7 again, after determining the expected dispatch time at step 703, at step 704, one or more lots of workpieces are assigned to the tool 103*a* on the basis of the determined expected dispatch time. This may be done as described above with reference to FIG. 6. In particular, a decision time may be determined from the expected dispatch time. At the decision time, a lot of workpieces may be selected for processing by the tool 103*a*, for example by first reordering a queue of lots of workpieces, and then assigning the lot of workpieces at the beginning of the queue to the tool 103*a*.

Thereafter, the one or more lots assigned to the tool 103*a* may be moved to the tool 103*a*, at step 705, and the one or more lots may be processed with the tool 103*a*, at step 706, as illustrated in FIG. 7. After the processing of the one or more lots by means of the tool 103*a*, or during the processing of the one or more lots by the tool 103*a*, at step 707, a measure of accuracy of the determined expected dispatch time may be determined. In some embodiments, the measure of accuracy of the expected dispatch time may be provided in the form of a time the tool 103*a* was idle before the processing of the one or more lots of workpieces by the tool 103*a* was started, a time one or more carriers used for transporting the one or more lots of workpieces to the tool 103*a* were idle before the processing of the one or more lots by the tool 103*a*, for example a time the carrier was stored in the buffer memory 109 associated with the tool 103*a* before the lot of workpieces in the carrier was processed by the tool 103*a*, or a measure of accuracy with which the one or more lots of workpieces were delivered to the tool 103*a* just in time, for example a time difference between the point in time at which the one or more lots of workpieces were delivered to the tool 103*a* and the time at which the processing of the one or more lots by the tool 103*a* was actually started.

In some embodiments, one or more of the time the tool 103*a* was idle, the time the one or more carriers were idle and the accuracy of the just-in-time-delivery may be combined with each other for providing the measure of the accuracy of the expected dispatch time, for example by a summation, such as a weighted summation, thereof.

Thereafter, at step 708, the first model may be updated on the basis of the determined measure of accuracy. For this purpose, a known machine learning process may be employed. In embodiments wherein the first model includes a data mining model, updating the first model may include a re-triggering of the multi-parameter regression and/or a re-triggering of the classification. In some embodiments, the classification may be re-triggered, if the regression does not fit any more, and the regression may be re-triggered if an accuracy of the data mining model has degraded too much.

In embodiments wherein the first model includes a state machine model, parameters of the state machine model, such as triggering conditions between states, may be adapted if the accuracy of the state machine model has degraded too much.

Further steps of a method according to an embodiment will be described with reference to FIG. 9. In some embodiments, these steps may be carried out by the host 106, for example by the local just-in-time model of the host 106.

Figure 9:
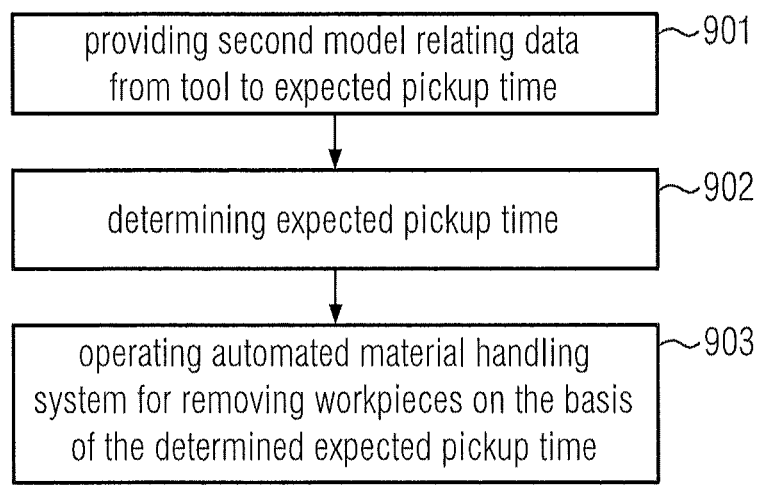
FIG. 9 shows a flow diagram illustrating steps of a method according to an embodiment.

Moreover, the method according to FIG. 9 may be used in combination with the methods described above with reference to FIGS. 7 and 8.

At step 901, a second model relating data from a tool in the system 100 to an expected pickup time when processing is completed may be provided. In the following, reference will be made to tool 103*a* wherein, however, methods as described in the following may also be applied for other tools such as, for example, tools 102*a*, 102*b*, 102*c*, 103*b*, 103*c*, 104*a*, 104*b*, 104*c*. The data from the tool 103*a* may correspond to the data from the tool 103*a* described above with reference to FIG. 7. Similar to the first model described above with reference to FIG. 7, the second model may include a data mining model, a state machine model or a combination of a data mining model and a state machine model.

Different from the first model, which relates the data from the tool 103*a* to an expected dispatch time at which one or more lots of workpieces are to be moved to the tool 103*a* for processing the one or more lots of workpieces by the tool 103*a*, the second model relates the data from the tool 103*a* to an expected pickup time, at which the one or more lots of workpieces are to be removed from the tool 103*a* after the processing of the one or more lots of workpieces. The removal of the one or more lots from the tool 103*a* may be performed by the automated material handling system 122, wherein, a vehicle, for example shuttle 417 described above with reference to FIG. 4, may be sent to the input/output port 420 of the tool 103*a*.

Providing the second model may be performed similar to the provision of the first model described above with reference to FIG. 7, wherein the pickup time is used instead of the dispatch time. In particular, the second model may include a data mining model, a state machine model and/or a combination of a data mining model and a state machine model.

At step 902, an expected pickup time is determined by using the second model and data received from the tool 103*a*. In some embodiments, data obtained for determining the expected dispatch time as described above may be used in step 902. In other embodiments, separate data may be retrieved from the tool 103*a* and/or other components of the system 100 as described above, for using the data in step 902.

Thereafter, at step 903, the automated material handling system 122 may be operated for removing one or more lots of workpieces that have been processed by the tool 103*a* on the basis of the determined expected pickup time. In some embodiments, a vehicle and/or a robot from the automated material handling system 122, for example shuttle 417 described above with reference to FIG. 4, may be sent to the tool 103*a* so that it arrives at the tool 103*a* substantially at the determined expected pickup time. Then, the vehicle and/or robot of the automated material handling system 122 may pick up the one or more lots of workpieces from the tool 103*a* and move them to other locations of the system 100.

Thus, the one or more lots of workpieces that were processed by the tool 103*a* may be removed relatively quickly from the tool 103*a*, so that a blocking of the input/output port 420 of the tool 103*a* by lots of workpieces that were processed by the tool 103*a* may be substantially avoided.

As already mentioned above, in some embodiments, models as described above with reference to FIGS. 7 to 9 may also be employed for determining an expected dispatch time of one or more lots to the plurality of second equipments 103, 104. In such embodiments, one or more models, which may include a data mining model, a state machine model or a combination of a data mining model and a state machine model, may be provided, wherein the one or more models relate data from the second equipments 103, 104 to the expected dispatch times. The one or more models may be provided by the just-in-time module 123 of the data processing arrangement 101. In some embodiments, an individual model may be provided for each of the second equipments 103, 104. In other embodiments, one model may be provided for two or more second equipments of the same type, for example second equipments including a particular set of tools.

Features of the each of the one or more models relating data from the second equipments 103, 104 to the expected dispatch times, and features of methods for providing the one or more models, may correspond to those of the first model described above with reference to FIGS. 7 to 9, wherein, however, data from the second equipments 103, 104 are employed instead of data from individual tools. The data from the second equipments 103 and 104, respectively, may be provided by the host 106 and the host 107, respectively, associated with the respective second equipment.

The data from the second equipments 103, 104 may be more abstract than the data from the tools 102a, 102b, 102c, 103a, 103b, 103c, 104a, 104b, 104c described above. For example, the data from the second equipments may include a time spent by each of the plurality of lots in the buffer storage before being moved to a first one of the tools of the second equipment that is used for processing the lot, a total time required for processing each of the lots by the second equipment and/or times required for processing each of the lots per tool. Moreover, the data may include information relating to paths of lots between the buffer storage associated with the second equipment and the tools of the second equipment, and paths between individual tools of the second equipment.

Additionally, the one or more models may relate data from the automated material handling system 122 to the expected dispatch time, for example a time taken by each of a plurality of lots of workpieces to move from the bulk storage 111 to the buffer storage associated with the respective second equipment, and a time required for moving a processed lot from the second equipment to the bulk storage 111 or directly to another equipment.

For determining the expected dispatch times, the just-in-time module 123 can receive data from the second equipments 103, 104 and/or the material handling system 122, and can use the one or more models to determine the expected dispatch time for each of the second equipments 103, 104. After processing the lot with the second equipment (step 608 in FIG. 6), a measure of accuracy may be determined, for example a time that tools of the second equipment were idle, and some or all of the one or more models may be updated on the basis of the determined measure of accuracy.

Features of the determination of the expected dispatch times by means of the one or more models, and features of the updating of the one or more models, may correspond to those of the first model described above with reference to FIGS. 7 to 9.

As detailed above, techniques as described above can use data obtained from components of the system 100 in a real-time fashion to perform a number of tasks and to actively predict a need for either delivery or pickup of work-in-process in a timely manner. Techniques as described above may be employed in a relatively universal manner to a variety of equipment type. In particular, techniques as described above may be applied to substantially any processing tool or metrology tool used in a semiconductor manufacturing facility. In addition to applications to the transport of lots of semiconductor wafers, when used in a semiconductor facility, techniques as described above may be applied to the transport of reticles (also denoted as "photomasks") between photolithography apparatuses and other equipment related to the use of reticles, such as, for example, reticle sorters and/or reticle inspection tools.

Moreover, techniques as described above are not limited to the technical field of semiconductor manufacturing, but may also be applied in other fields of technology wherein workpieces are transported by an automated material handling system.

Embodiments disclosed herein include computer storage media such as, for example, hard disks, solid state disks, flash memory devices such as USB sticks and/or flash memory cards, CDs and DVDs including code for causing a data processing arrangement, such as data processing arrangement 101 described above, to perform methods as described herein. The code may be provided in the form of a software module providing the just-in-time-module 123 and/or local just-in-time modules provided in hosts 105, 106, 107, and working with multiple equipment types at the same time, and it may be scalable to work on a series of automated material handling systems and equipment types.

In some embodiments, techniques as described above may be employed in a material handling system as described in U.S. Pat. No. 5,980,183, the disclosure of which is incorporated herein by reference, and/or in other conventional automated material handling systems.

In some embodiments, techniques as described herein may be used for predicting the dispatch or pickup of work-in-process with an accuracy of ±10 seconds at times of in a range from about five minutes or more to about 30 minutes or more before the actual dispatch time or pickup time, and the accuracy may be improved over time based on the adaptation of the first and the second model. In addition to predicting the next pickup or drop-off of lots of workpieces, entire schedules of pickups and drop-offs may be created based on multiple requests potentially affecting the system at the same time.

In further embodiments, geographical optimization may be performed based on historical data of travel times and speed of the automated material handling system 122 when more than one move is to be done at approximately the same time by the automated material handling system 122 for improving throughput of the system 100.

The present disclosure is not limited to embodiments wherein lots of workpieces are fixedly assigned to carriers. In other embodiments, carriers may be separated from lots, so that carriers can move across many tools while work is in process. For instance, two lots may be processed by means of different tools, although they have arrived at the same carrier.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
processing each of a plurality of lots with a respective one of at least one first equipment, wherein each of said plurality of lots comprises a plurality of semiconductor wafers, wherein each of said at least one first equipment performs one or more first steps of a semiconductor manufacturing process for each wafer of each of said plurality of lots that is processed with the respective first equipment;
moving at least some of said plurality of lots from said respective one of said at least one first equipment to a first storage;
for each of a plurality of second equipments, determining an expected dispatch time of one or more next lots for processing by said second equipments, wherein each of said plurality of second equipments performs one or more second steps of the semiconductor manufacturing process for each wafer of each of said plurality of lots that is processed with the respective second equipment;
assigning each of the lots in said first storage to one of said plurality of second equipments on the basis of at least the determined expected dispatch time, wherein said assigning each of the lots in said first storage to one of said plurality of second equipments is additionally performed on the basis of a priority of each of the lots, a number of lots present in each of said plurality of second storages, and a status of each of said second storages;
moving each of the lots in said first storage to one of a plurality of second storages that is associated with the one of said plurality of second equipments to which the respective lot was assigned; and
for each of said plurality of second equipments, moving each of the lots in said second storage associated with the second equipment to the second equipment and processing the lots from said second storage associated with the second equipment with the second equipment, wherein each of said plurality of second storages is closer to the one of the plurality of second equipments associated with the second storage than the first storage, and a storage space of said first storage is greater than a storage space of any of said plurality of second storages.

2. The method of claim 1, wherein at least one of said at least one first equipment and said plurality of second equipments comprises a plurality of tools.

3. The method of claim 2, wherein said plurality of tools comprises a first tool and a second tool that successively perform different steps of the semiconductor manufacturing process.

4. The method of claim 2, wherein moving each of said lots from the respective one of said at least one first equipment to said first storage and moving each of said lots in said first storage to one of said plurality of second storages that is associated with said one of the plurality of second equipments to which the respective lot was assigned are performed by an automated material handling system.

5. The method of claim 4, wherein said first storage is closer to each of said at least one first equipment than any of said plurality of second storages.

6. The method of claim 1, wherein a storage space of each of said plurality of second storages is at least one of less than about one-half of the storage space of said first storage, less than about one-fifth of the storage space of said first storage and in a range from one-tenth to one-fifth of the storage space of said first storage.

7. The method of claim 1, wherein the storage space of each of said plurality of second storages is sufficient to store a number of lots that is at least one of equal to and greater than a maximum number of lots that can be processed by the second equipment associated with the second storage during a predetermined delay buffer time.

8. The method of claim 1, wherein each of the lots in said first storage is assigned to one of said plurality of second equipments after a point in time of an insertion of the respective lot into said first storage.

9. The method of claim 8, further comprising determining a decision time at which at least one of the lots in said first storage is to be assigned to one of said plurality of second equipments at least on the basis of the determined expected dispatch time, wherein the assigning of each of the lots in said first storage to one of said plurality of second equipments is performed at the determined decision time.

10. The method of claim 9, wherein the expected dispatch times are determined on the basis of expected times of availability of the second equipments, estimated transport times between the first storage and each of the plurality of second storages and estimated transport times between the plurality of second storages and the respective ones of the plurality of second equipments associated therewith.

11. The method of claim 1, wherein the method further comprises:
providing one or more models, the one or more models relating at least data from at least said plurality of second equipments to the expected dispatch times;
wherein the determination of the expected dispatch times comprises:
receiving data from at least said plurality of second equipments; and
using said one or more models and the received data to determine, for each of said plurality of second equipments, the expected dispatch time.

12. The method of claim 11, further comprising:
for at least a portion of said plurality of second equipments, determining a measure of an accuracy of the expected dispatch time determined for said second equipments; and
updating at least a portion of said one or more models on the basis of the determined measures of accuracy.

13. The method of claim 12, wherein the updating of at least a portion of said one or more models comprises performing a machine learning algorithm.

14. A method, comprising:
providing a first model, said first model relating at least data from a tool to an expected dispatch time of one or more next lots for processing by the tool, wherein said first model comprises a combination of a data mining model and a state machine model;
receiving at least said data from said tool;
using said first model and said received data to determine the expected dispatch time;
assigning one or more first lots of workpieces to said tool on the basis of said determined expected dispatch time, moving said one or more first lots of workpieces to said tool and processing said one or more first lots of workpieces by means of said tool, wherein each of said workpieces of said one or ore first lots comprises a semiconductor wafer, wherein said tool is a semiconductor tool, the processing of said workpieces of said one or more first lots comprises performing one or more steps of a process for forming semiconductor devices;

determining a measure of accuracy of said determined expected dispatch time;
updating said first model on the basis of said determined measure of accuracy, wherein the updating of said first model comprises performing a machine learning algorithm;
determining if a decision criterion is fulfilled;
determining the expected dispatch time by means of said state machine model if said decision criterion is fulfilled, and
determining the expected dispatch time by means of said data mining model if said decision criterion is not fulfilled.

15. The method of claim 14, wherein said tool comprises a plurality of stations, and wherein said data from said tool comprises at least one of:
a time taken by each of a plurality of wafers of one or more second lots to move from at least one carrier to a first one of said plurality of stations;
a time taken by each of said wafers of said one or more second lots to move from a last one of said plurality of stations back to said at least one carrier;
a time taken by each of said wafers of said one or more second lots at each of said plurality of stations;
a number of wafers currently in said tool;
a processing time per wafer of said one or more second lots related to process steps;
a time taken by each of said at least one carrier to perform at least one of docking said carrier, undocking said carrier, scanning a wafer map of said carrier, receiving a process recipe for one of the processing of said one or more second lots associated with the carrier, and creating a job for processing said one or more second lots;
a time taken by each of said at least one carrier to complete after a last one of said wafers of said one or more second lots associated with said carrier has returned to said carrier after processing;
information relating to correlations between wafers processed by said tool at different times;
historic states of said tool comprising at least one of a standby time, a productive time and a time since a last preventive maintenance;
one or more paths of said wafers of said one or more second lots through said plurality of stations of said tool related to a process recipe.

16. The method of claim 15, wherein said tool comprises a plurality of processing chambers, and wherein said data from said tool comprises a distribution of wafer loading over said plurality of chambers.

17. The method of claim 15, wherein said tool has a storage associated therewith, and wherein said data received from said tool further comprise states of one or more stored lots in said storage.

18. The method of claim 15, wherein said first model additionally relates data from an automated material handling system to the expected dispatch time.

19. The method of claim 18, wherein said data from said automated material handling system comprises at least one of:
a time taken by said automated material handling system to move said at least one carrier from a first location to a second location;
a time taken by said automated material handling system to pick up said at least one carrier; and
a time taken by said automated material handling system to deliver said at least one carrier.

20. The method of claim 18, further comprising:
providing a second model, said second model relating at least the data from said tool to an expected pickup time at which a processing of a plurality of work-in-process workpieces at said tool is completed;
using said second model and the data received from said tool to determine an expected pickup time; and
operating said automated material handling system for removing said work-in-process workpieces from said tool on the basis of the determined expected pickup time.

21. The method of claim 18, further comprising maintaining a queue comprising a plurality of lots of workpieces to be processed, said plurality of lots of workpieces comprising said one or more first lots of workpieces, and wherein the assigning of said one or more first lots of workpieces to said tool further comprises reordering the queue.

22. The method of claim 14, wherein each of said one or more first lots of workpieces is provided in at least one carrier when said one or more first lots of workpieces are moved to said tool, wherein two or more lots of workpieces are provided in each of said at least one carrier.

23. A system, comprising:
means for processing each of a plurality of lots with a respective one of at least one first equipment, wherein each of said plurality of lots comprises a plurality of semiconductor wafers, wherein each of said at least one first equipment performs one or more first steps of a semiconductor manufacturing process for each wafer of each of said plurality of lots that is processed with the respective first equipment;
means for moving at least some of said plurality of lots from the respective one of said at least one first equipment to a first storage;
means for determining, for each of a plurality of second equipments, an expected dispatch time of one or more next lots for processing by said second equipments, wherein each of said plurality of second equipments performs one or more second steps of the semiconductor manufacturing process for each wafer of each of said plurality of lots that is processed with the respective second equipment;
means for assigning each of said lots in said first storage to one of said plurality of second equipments on the basis of at least the determined expected dispatch times wherein said assigning each of the lots in said first storage to one of said plurality of second equipments is additionally performed on the basis of a priority of each of the lots, a number of lots present in each of said plurality of second storages, and a status of each of said second storages;
means for moving each of said lots in said first storage to one of a plurality of second storages that is associated with the one of said plurality of second equipments to which the respective lot was assigned; and
means for moving, for each of said plurality of second equipments, each of said lots in said second storage associated with said second equipments to said second equipments and processing said lots from said second storage associated with said second equipments with said second equipment, wherein each of said plurality of second storages is closer to the one of the plurality of second equipments associated with the second storage than the first storage, and a storage space of said first storage is greater than a storage space of any of said plurality of second storages.

24. A computer-readable storage medium comprising code for causing a data processing arrangement to:
- provide a model, said model relating at least data from a tool to an expected dispatch time of one or more next lots for processing by said tool, wherein said first model comprises a combination of a data mining model and a state machine model;
- receive at least said data from said tool through a network connection;
- use said model and said received data to determine the expected dispatch time;
- assign one or more lots of workpieces to said tool on the basis of said determined expected dispatch time;
- send a first signal to an automated material handling system through said network connection, said first signal causing said automated material handling system to move said one or more lots of workpieces to said tool;
- send a second signal to said tool through said network connection, said second signal causing said tool to process said one or more lots of workpiece wherein each of said workpieces of said one or more first lots comprises a semiconductor wafer, wherein said tool is a semiconductor tool, the processing of said workpieces of said one or more first lots comprises performing one or more steps of a process for forming semiconductor devices;
- determine a measure of accuracy of said determined expected dispatch time;
- update said model on the basis of said determined measure of accuracy, wherein the updating of said first model comprises performing a machine learning algorithm;
- determine if a decision criterion is fulfilled:
- determine the expected dispatch time by means of said state machine model if said decision criterion is fulfilled; and
- determine the expected dispatch time by means of said data mining model if said decision criterion is not fulfilled.

25. A method, comprising:
- processing each of a plurality of lots with a respective one of at least one first equipment, wherein each of said plurality of lots comprises a plurality of semiconductor wafers, wherein each of said at least one first equipment performs one or more first steps of a semiconductor manufacturing process for each wafer of each of said plurality of lots that is processed with the respective first equipment;
- moving at least some of said plurality of lots from said respective one of said at least one first equipment to a first storage;
- for each of a plurality of second equipments, determining an expected dispatch time of one or more next lots for processing by said second equipments, wherein each of said plurality of second equipments performs one or more second steps of the semiconductor manufacturing process for each wafer of each of said plurality of lots that is processed with the respective second equipment;
- assigning each of the lots in said first storage to one of said plurality of second equipments on the basis of at least the determined expected dispatch time;
- moving each of the lots in said first storage to one of a plurality of second storages that is associated with the one of said plurality of second equipments to which the respective lot was assigned; and
- for each of said plurality of second equipments, moving each of the lots in said second storage associated with the second equipment to the second equipment and processing the lots from said second storage associated with the second equipment with the second equipment, wherein each of said plurality of second storages is closer to the one of the plurality of second equipments associated with the second storage than the first storage, a storage space of said first storage is greater than a storage space of any of said plurality of second storages, and the storage space of each of said plurality of second storages is sufficient to store a number of lots that is at least one of equal to and greater than a maximum number of lots that can be processed by the second equipment associated with the second storage during a predetermined delay buffer time.

* * * * *

UNITED STATES PATENT AND TRADEMARK OFFICE
CERTIFICATE OF CORRECTION

PATENT NO.         : 9,748,088 B2
APPLICATION NO.    : 14/100610
DATED              : August 29, 2017
INVENTOR(S)        : Gero Grau et al.

It is certified that error appears in the above-identified patent and that said Letters Patent is hereby corrected as shown below:

In the Claims

Column 30, Line 62 (Claim 14, Line 15), change "ore" to -- more --.

Column 33, Line 21 (Claim 24, Line 21), change "workpiece" to -- workpieces, --.

Column 33, Line 34 (Claim 24, Line 34), change "fulfilled:" to -- fulfilled; --.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*